(12) United States Patent
Torek et al.

(10) Patent No.: US 7,468,323 B2
(45) Date of Patent: Dec. 23, 2008

(54) METHOD OF FORMING HIGH ASPECT RATIO STRUCTURES

(75) Inventors: Kevin Torek, Meridian, ID (US); Kevin Shea, Boise, ID (US); Thomas Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 10/788,899

(22) Filed: Feb. 27, 2004

(65) Prior Publication Data

US 2005/0191856 A1 Sep. 1, 2005

(51) Int. Cl.
H01L 21/302 (2006.01)

(52) U.S. Cl. .......... 438/704; 438/243; 438/244; 438/710; 438/723; 438/753; 216/57; 216/79; 216/80; 216/99; 134/1.3

(58) Field of Classification Search ............ None
See application file for complete search history.

(56) References Cited

U.S. PATENT DOCUMENTS

| | | | | |
|---|---|---|---|---|
| 5,168,073 A * | 12/1992 | Gonzalez et al. | ........ | 438/397 |
| 5,234,540 A | 8/1993 | Grant et al. | ........ | 156/646 |
| 5,439,553 A | 8/1995 | Grant et al. | ........ | 216/58 |
| 5,496,757 A * | 3/1996 | Rosner | ........ | 438/253 |
| 5,685,951 A | 11/1997 | Torek et al. | ........ | 156/646.1 |
| 5,770,510 A * | 6/1998 | Lin et al. | ........ | 438/396 |
| 5,783,495 A | 7/1998 | Li et al. | ........ | 438/738 |
| 5,817,182 A * | 10/1998 | O'Brien | ........ | 134/1.3 |
| 5,885,903 A | 3/1999 | Torek et al. | ........ | 438/756 |
| 5,966,611 A * | 10/1999 | Jost et al. | ........ | 438/397 |
| 5,981,401 A | 11/1999 | Torek et al. | ........ | 438/745 |
| 5,990,019 A | 11/1999 | Torek et al. | ........ | 438/723 |
| 6,087,273 A | 7/2000 | Torek | ........ | 438/756 |
| 6,090,683 A | 7/2000 | Torek | ........ | 438/424 |
| 6,103,637 A | 8/2000 | Torek et al. | ........ | 438/745 |
| 6,150,277 A | 11/2000 | Torek | ........ | 438/705 |
| 6,165,853 A | 12/2000 | Nuttall et al. | ........ | 438/296 |
| 6,194,286 B1 | 2/2001 | Torek | ........ | 438/424 |
| 6,200,909 B1 | 3/2001 | Torek et al. | ........ | 438/745 |
| 6,232,232 B1 | 5/2001 | Lee et al. | ........ | 438/694 |
| 6,235,145 B1 | 5/2001 | Li et al. | ........ | 156/345 |
| 6,290,863 B1 | 9/2001 | Morgan et al. | ........ | 216/73 |
| 6,350,547 B1 | 2/2002 | Torek | ........ | 430/5 |
| 6,372,657 B1 | 4/2002 | Hineman et al. | ........ | 438/723 |
| 6,453,914 B2 | 9/2002 | Torek et al. | ........ | 134/1.2 |
| 6,517,738 B1 | 2/2003 | Torek et al. | ........ | 252/79.1 |
| 6,541,391 B2 | 4/2003 | Smith et al. | ........ | 438/754 |
| 6,559,498 B2 * | 5/2003 | Kitamura | ........ | 257/309 |
| 6,562,726 B1 | 5/2003 | Torek et al. | ........ | 438/745 |
| 6,576,557 B1 | 6/2003 | Torek et al. | ........ | 438/700 |

(Continued)

FOREIGN PATENT DOCUMENTS

KR 2001037699 A * 5/2001

*Primary Examiner*—Anita K Alanko
(74) *Attorney, Agent, or Firm*—Schwegman, Lundberg & Woessner, P.A.

(57) ABSTRACT

An etching process includes providing a dielectric first film on a substrate and a sacrificial second film on the dielectric first film. A conductive structure such as a container capacitor is formed in a recess in the first and second films. The conductive structure is exposed as to its external surface by an etch process that resists destructive collapse of the conductive structure.

15 Claims, 14 Drawing Sheets

U.S. PATENT DOCUMENTS

| | | | |
|---|---|---|---|
| 6,589,884 B1 | 7/2003 | Torek | 438/755 |
| 6,599,683 B1 | 7/2003 | Torek et al. | 430/326 |
| 6,645,874 B1 | 11/2003 | Torek et al. | 438/723 |
| 6,709,983 B2 | 3/2004 | Torek et al. | 438/700 |
| 6,734,089 B1 | 5/2004 | Hu et al. | 438/585 |
| 6,740,593 B2 | 5/2004 | Torek | 438/700 |
| 6,740,597 B1 | 5/2004 | Torek et al. | 438/725 |
| 6,764,947 B1 * | 7/2004 | Chan et al. | 438/645 |
| 6,825,121 B2 * | 11/2004 | Kwean et al. | 438/694 |
| 6,830,979 B2 * | 12/2004 | Wada | 438/303 |
| 2001/0037816 A1 | 11/2001 | Torek et al. | 134/1 |
| 2001/0051440 A1 | 12/2001 | Torek et al. | 438/745 |
| 2002/0119656 A1 | 8/2002 | Smith et al. | 438/687 |
| 2002/0127795 A1 * | 9/2002 | Shih | 438/243 |
| 2002/0163026 A1 * | 11/2002 | Park | 257/301 |
| 2003/0143869 A1 | 7/2003 | Torek et al. | 438/789 |
| 2003/0143870 A1 | 7/2003 | Torek et al. | 438/789 |
| 2003/0196678 A9 | 10/2003 | Torek et al. | 134/1 |
| 2003/0222241 A1 | 12/2003 | Torek et al. | 252/79.1 |
| 2004/0018679 A1 * | 1/2004 | Yu et al. | 438/253 |
| 2004/0147074 A1 * | 7/2004 | Sell et al. | 438/243 |
| 2004/0175884 A1 * | 9/2004 | Kang et al. | 438/254 |
| 2005/0191856 A1 | 9/2005 | Torek et al. | |
| 2005/0287795 A1 | 12/2005 | Torek et al. | |

* cited by examiner

METHOD OF FORMING HIGH ASPECT RATIO STRUCTURES

TECHNICAL FIELD

An embodiment of this disclosure relates to semiconductor fabrication methods. More particularly, an embodiment that relates to etching methods for use in exposing high aspect ratio structures and for use in recess profile improvement.

BACKGROUND

Various etching processes are used in the fabrication of semiconductor devices. Such etching processes are used to control and maintain critical dimensions of various device structures such as, for example, transistors, capacitors, and interconnects. As semiconductor devices become more integrated and miniaturized, the maintenance and control of such critical dimensions of device structures increases in importance.

During the formation of semiconductor devices, such as dynamic random access memories (DRAMs), static random access memories (SRAMs), microprocessors, etc., various layers are etched to form insulating structures, e.g., openings, used for various purposes. Such purposes may include the formation of capacitor structures, contact structures, interconnect structures, etc. For example, with respect to capacitor structures, it is often required that a conductive structure be deposited on the inner surface of a recess in a dielectric layer.

The profile of such conductive structures is of particular importance, for example, such that desired characteristics are exhibited when further processing is carried out relative to the structure. For example, in many circumstances it is preferred to have openings having near vertical profiles, e.g., at least one wall being near vertical.

For example, with respect to a contact hole or via, a near vertical wall defining the opening into which conductive structure is formed provides a larger area at the bottom of the opening as opposed to an opening defined by walls that are less than vertical. Contact resistance for a contact formed in the opening is sensitive to the area at the bottom of the opening.

Further, for example, with respect to a conductive structure such as a container capacitor illustratively described in U.S. Pat. No. 5,392,189 to Fazan et al., near vertical walls defining a container opening in which a conductive structure is formed provides a significant increase in cell capacitance for a given height of a capacitor structure relative to a container opening defined by walls that are less than vertical. For example, an opening defined with near vertical walls extending from a bottom surface will generally provide a greater surface area upon which an electrode of a capacitor can be formed relative to a recess having sloped walls which are less than vertical.

It is difficult to etch a recess in a dielectric layer that results in walls that are generally near vertical. This is particularly true with respect to high aspect ratio openings. It is known to utilize dry etch plasmas containing fluorocarbons or hydrofluorocarbons to etch oxides, or other dielectric layers, relative to underlying conductive layers, e.g., silicon-containing layers such as doped silicon, polysilicon, or other conductive materials.

After a recess has been formed by a profile-straightening etch, if necessary, the electrode of a container capacitor is formed. But a high-aspect ratio container capacitor in submicron geometries suffers from fragility that cannot survive etching and rinsing that expose the exterior surface of the container capacitor. Often, the rinsing causes adjacent container capacitors to collapse due to the surface tension of the rinse solution.

BRIEF DESCRIPTION OF THE DRAWINGS

In order to illustrate the manner in which embodiments are obtained, a more particular description will be rendered by reference to specific embodiments that are illustrated in the appended drawings. Understanding that these drawings depict only typical embodiments that are not necessarily drawn to scale and are not therefore to be considered to be limiting of its scope, the invention will be described and explained with additional specificity and detail through the use of the accompanying figures in which.

SUMMARY

Figure 1:
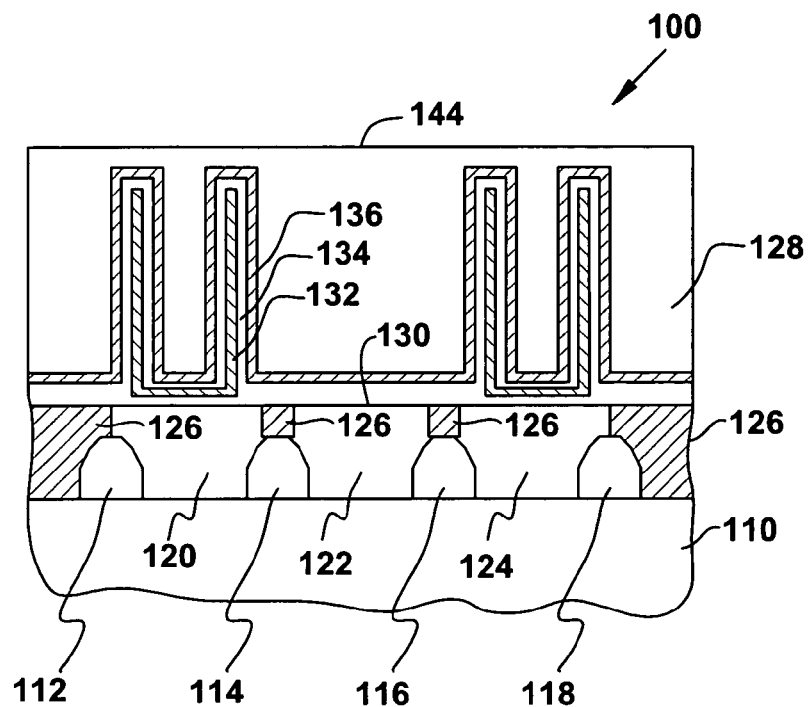
FIG. 1 is a cross section of a container capacitor structure according to an embodiment.

In an embodiment, a process includes forming a first recess in a substrate, followed by forming a conductive structure in the first recess. Next a first etch is carried out to expose a first portion of the conductive structure. The first etch is followed up by a first rinsing process. Thereafter, a non-wet second etching process is carried out to expose a second portion of the conductive structure. In an embodiment, profile straightening of the first recess is carried out before formation of the conductive structure therein. In an embodiment, the first etching is a wet etching that etches at a rate that is faster than non-wet second etching.

In an embodiment, the conductive structure that is exposed during the wet first etching and the non-wet second etching, includes an aspect ratio from about 0.5:1 to about 25:1.

In an embodiment, an intermediate system includes the substrate, the conductive structure, and the solution and reaction products of the non-wet second etch. In an embodiment, the intermediate system also includes the solution and reaction products of the first etch, proximate the substrate.

The electrical device also can include a chip package that contains the conductive structure. In an embodiment, an electronic system includes a circuit module and a user interface. The circuit module includes the conductive structure.

DETAILED DESCRIPTION

In the following detailed description, reference is made to the accompanying drawings that form a part hereof, and in which is shown, by way of illustration, specific ways that embodiments may be practiced. In the drawings, like numerals describe substantially similar components throughout the several views. These embodiments are described in sufficient detail to enable those skilled in the art to practice various embodiments. Other embodiments may be utilized and structural, logical, and electrical changes may be made without departing from the scope of the various embodiments. The terms wafer and substrate used in the following description include any structure having an exposed surface with which to form an integrated circuit ("IC") structure embodiment.

The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "above", "lower", "over", "below", and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIG. 1 is a cross section of a container capacitor structure 100 according to an embodiment. A substrate 110 includes an active area (not pictured) and a series of gate stacks 112, 114, 116, and 118. The container in the container capacitor structure is electrically coupled to the substrate 110. Between the gate stacks 112 and 114 is a first cell landing pad 120. Between the gate stacks 114 and 116 is a digit line landing pad 122. And between the gate stacks 116 and 118 is a second cell landing pad 124. By way of non-limiting example, the cell landing pads 120, 124 and the digit line landing pad 122 are isolated from each other by a dielectric 126.

An upper dielectric stack 128 is disposed above an upper surface 130 of the cell landing pads 120, 124 and the digit line landing pad 122. Container capacitors 132 are disposed upon the first cell landing pad 120 and the second cell landing pad 124. A storage cell dielectric film 134 is disposed over the container capacitor 132. Finally as to the container capacitor structure 100, a storage cell plate 136 is disposed over the storage cell dielectric film 134. Incidental to the container capacitor structure 100, the upper dielectric stack 128 is referred to as such because of processing conditions, set forth below.

FIG. 1 illustrates a two-cell container capacitor structure 100. A digit line (not pictured), in an embodiment a buried digit line (not pictured) is to be brought into contact with the digit line landing pad 122. Thereby, the container capacitors 132 can be accessed according to an embodiment. In an embodiment, the gate stack 114 is activated and the left cell either sends or receives a charge through the digit line landing pad 122. In another embodiment, the gate stack 116 is activated and the right cell either sends or receives a charge through the digit line landing pad 122.

Figure 1A:
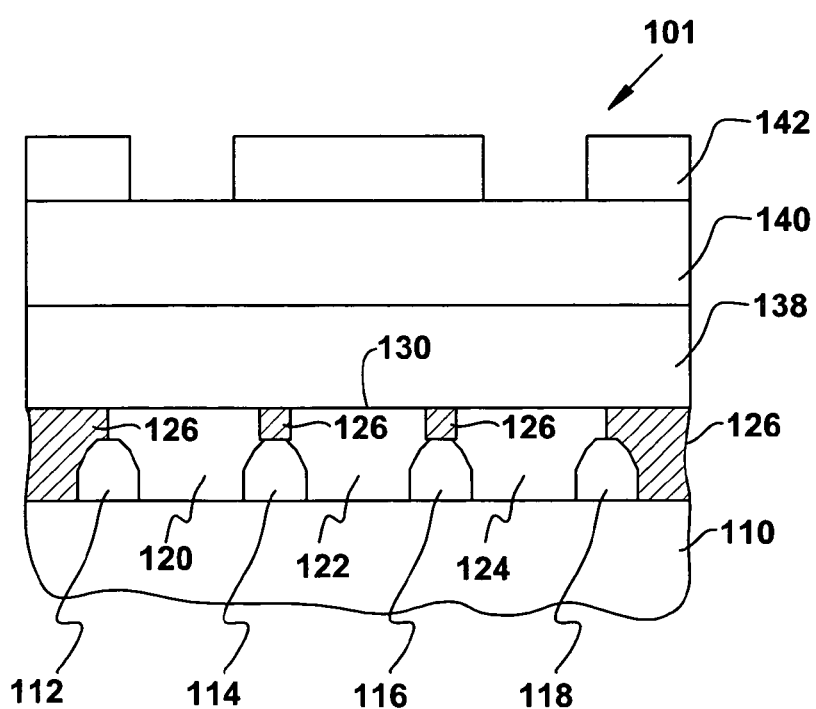
FIG. 1A is a cross section of the container capacitor structure depicted in FIG. 1 during processing according to an embodiment.

FIG. 1A is a cross section of the container capacitor structure during processing according to an embodiment. The structure 101 is subjected to various processes to arrive at the container capacitor structure 100 depicted in FIG. 1. In an embodiment, the upper surface 130 has been formed after an etch-and-poly-fill process. The etch-and-poly-fill process has resulted in the first cell landing pad 120, the digit line landing pad 122, and the second cell landing pad 124. In an embodiment, the upper surface 130 is achieved by a chemical-mechanical polishing (CMP) process. In an embodiment, the polysilicon precursor material for the landing pads is an n-doped polysilicon that can be in situ doped during a chemical vapor deposition ("CVD") process. In an embodiment, the polysilicon precursor material for the landing pads is a p-doped polysilicon that can be in situ doped during a CVD process. In an embodiment, however, the polysilicon landing pads are not present, and the formation of a container recess bottoms out at the substrate 110.

A dielectric first film 138 is disposed over the upper surface 130. A sacrificial second film 140 is disposed above and on the dielectric first film 138. Thereafter, a mask 142 is disposed and patterned directly above the first cell landing pad 120 and the second cell landing pad 124. In an embodiment, the dielectric first film 138 and the sacrificial second film 140 are dissimilar materials, such that they respond differently to a given etch recipe or a series of etch recipes.

Figure 1B:
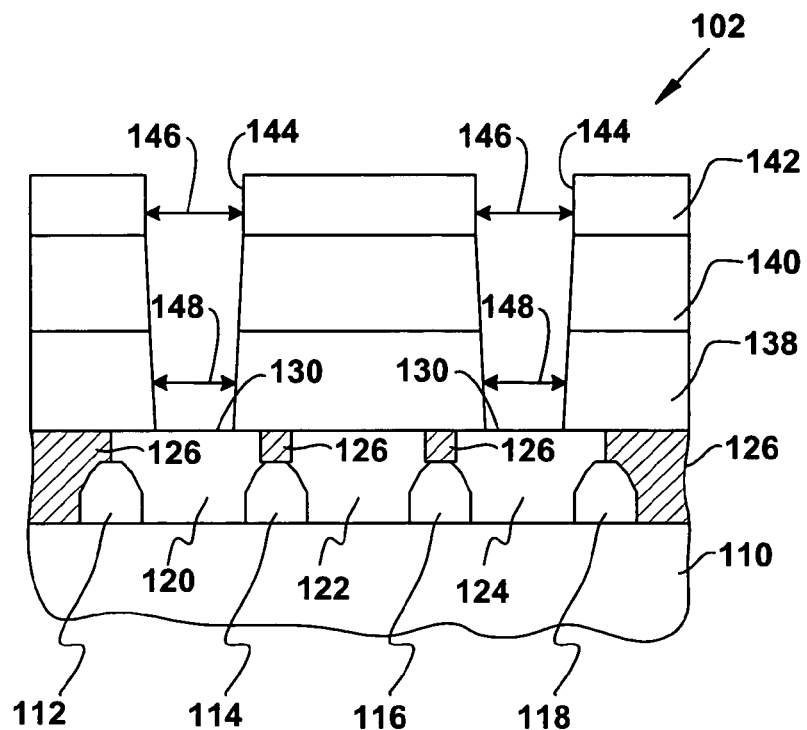
FIG. 1B is a cross section of the structure depicted in FIG. 1A after further processing.

FIG. 1B is a cross section of the structure depicted in FIG. 1A after further processing. The container capacitor structure 102 has been etched to form a first recess 144 that exposes the upper surface 130. Because of the etch process, the first recess 144 is tapered to include a first characteristic dimension 146 at or near the top of the first recess 144, and a second, smaller characteristic dimension 148 at or near the bottom of the first recess 144.

In an embodiment where the first recess 144 is used to form a container capacitor, the tapered profile is adjusted to create a stronger container at the upper surface 130, and to increase the surface area of the container.

An embodiment provides for profile straightening of the first recess 144. The profile straightening can include a dry etch to form the first recess 144, followed by a wet etch that is selective to not etching the sacrificial second film 140 as fast as the dielectric first film 138. Such profile straightening can be ascertained in U.S. Pat. No. 6,531,728 to DeBoer et al., which is incorporated herein by reference.

Figure 1C:
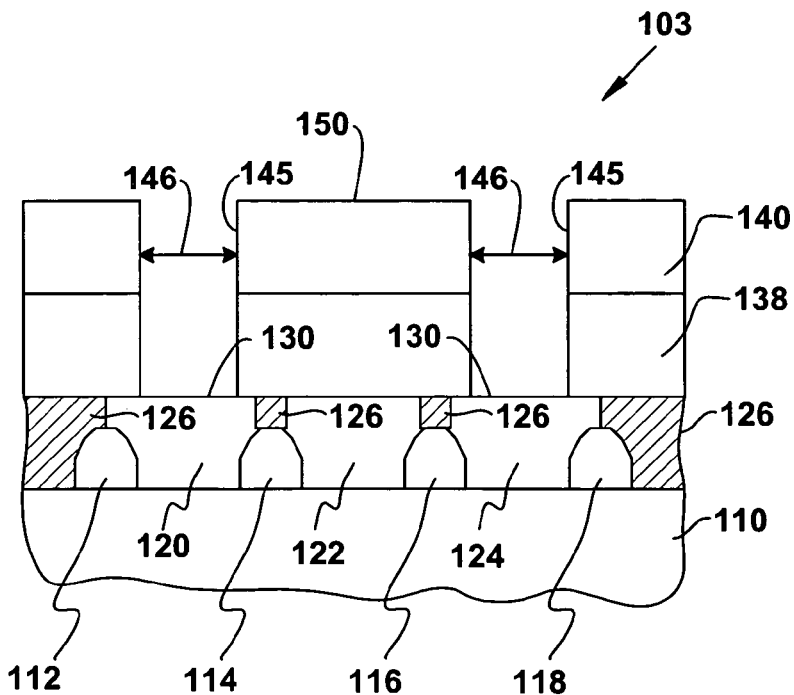
FIG. 1C is a cross section of the structure depicted in FIG. 1B after further processing.

FIG. 1C is a cross section of the structure 103 depicted in FIG. 1B after further processing. The profile straightening has achieved a second recess 145 that is significantly less tapered, if at all, than the first recess 144 depicted in FIG. 1B. After profile straightening, the second recess 145 is ready to receive a conductive film that will act as the bottom electrode in a container capacitor according to an embodiment.

In an embodiment, the depth of the second recess 145 is in a range from about 0.5 micrometer (μm) to about 5 μm. In an embodiment, the depth of the second recess 145 is in a range from about 1 μm to about 4 μm. In an embodiment, the depth of the second recess 145 is in a range from about 2 μm to about 3 μm.

The aspect ratio of the second recess 145 is related to the depth and the width. The aspect ratio is the ratio of the height of the second recess 145 from the top surface 150 of the sacrificial second film 140 to the bottom of the second recess 145 at the top surface 130, divided by the first characteristic dimension 146 of the second recess 145. In an embodiment, the aspect ratio is in a range from about 0.5:1 to about 25:1. In an embodiment, the aspect ratio is in a range from about 1:1 to about 20:1. In an embodiment, the aspect ratio is in a range from about 2:1 to about 15:1. In an embodiment, the aspect ratio is in a range from about 5:1 to about 10:1. In an embodiment, the aspect ratio is in a range from about 6:1 to about 9:1.

Figure 1D:
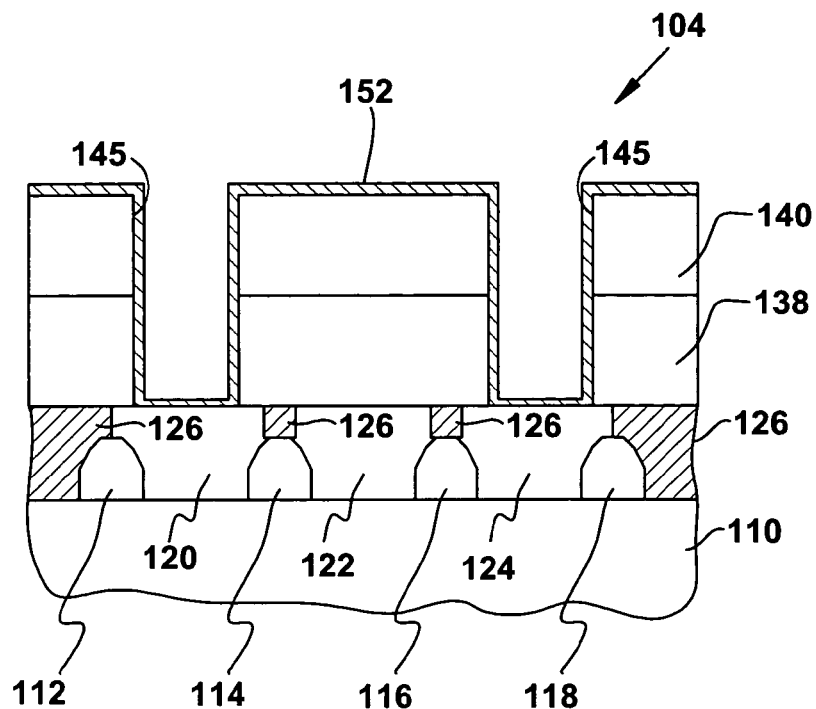
FIG. 1D is a cross section of the structure depicted in FIG. 1C after further processing.

FIG. 1D is a cross section of the structure 104 depicted in FIG. 1C after further processing. A conductive film 152 has been formed in the second recess 145 by a deposition process. In an embodiment, the conductive film 152 is a doped polysilicon that is formed by CVD under conditions that achieve a deposited film at the upper surface 130 if present, or at the bottom of the second recess 145. In an embodiment, the conductive film 152 is a metal nitride that is conductive enough for a bottom electrode of a container capacitor. In an embodiment, the conductive film 152 is a metal. In an embodiment, the conductive film 152 is an alloy. In an embodiment, the conductive film 152 is a metal/metal nitride composite such as a titanium/titanium nitride composite. Each of these conductive film embodiments is applicable to be formed in each embodiment of the first recess 144 or of the second recess 145. Accordingly, the recess in general is any of the dielectric first film 138 and sacrificial second film 140 permutations set forth in this disclosure.

Figure 1E:
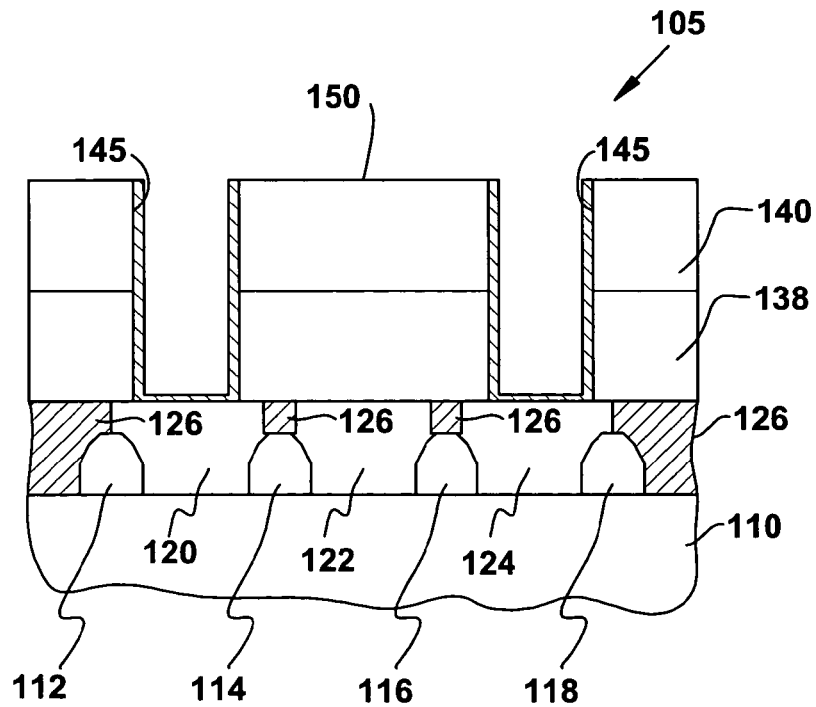
FIG. 1E is a cross section of the structure depicted in FIG. 1D after further processing.

FIG. 1E is a cross section of the structure 105 depicted in FIG. 1D after further processing. A planarization process is carried out to break the continuity of the conductive film 152 (FIG. 1D) to form the isolated containers that make up the container capacitors 132. In an embodiment, planarization is preceded by a process that fills the second recess 145 such as with a photoresist material (not pictured). In an embodiment, planarization is a CMP process that stops on the upper surface 150 of the sacrificial second film. In an embodiment with the second recess 145 filled with a dummy material such as a photoresist material, planarization is a chemical etchback process that stops on the upper surface 150 of the sacrificial second film 140 is carried out under etch conditions that are rapid, and that stop on the dielectric first film.

Figure 1F:
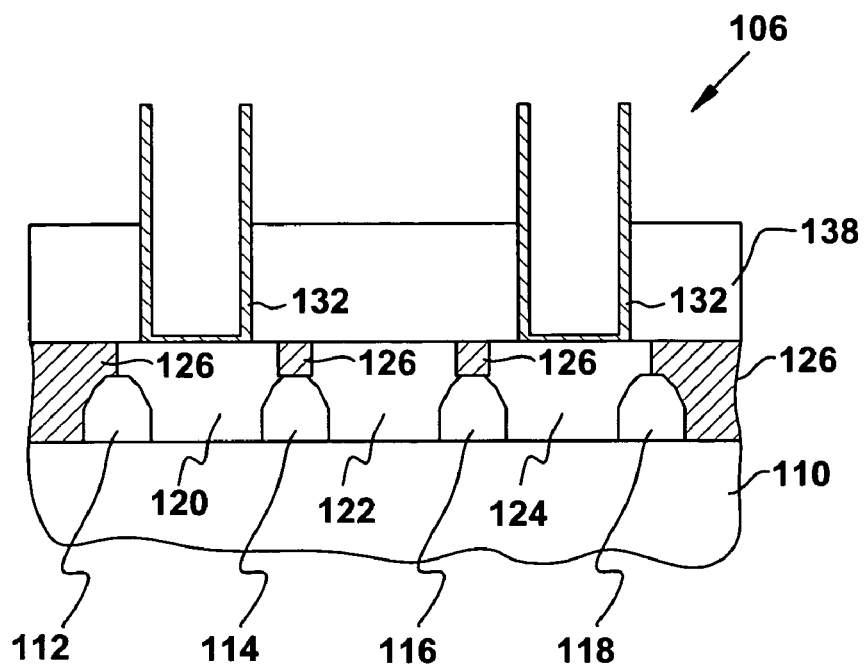
FIG. 1F is a cross section of the structure depicted in FIG. 1E after further processing.

FIG. 1F is a cross section of the structure 106 depicted in FIG. 1E after further processing. In an embodiment, removal of the sacrificial second film 140 (FIG. 1E) is carried out under conditions of a first etch, followed by a first rinse. The first etch stops on the dielectric first film 138, such that the first etch is selective to leaving the dielectric first film 138. Further, the first etch is selective to leaving the container 132, and the rinse is carried out with the container 132 sufficiently anchored in the dielectric first film 138 that surface tension in the rinse liquid is not sufficient to damage the container 132. Typical damage avoided is the collapsing of the container 132, due to surface tension in the first rinse fluid.

In an embodiment, the process omits the non-wet second etch and the structure 100 includes the container 132 still embedded in the last portion of the dielectric film 138, with the storage cell dielectric film 134 and the storage cell plate 136 disposed over the last portion of the dielectric film 138 (not pictured in FIG. 1) and over the container 132. Consequently, the structure 100 would appear as it does in FIG. 1, with the addition, however, that the last portion of the dielectric film 138 would lie upon the upper surface 130 and abut the lower portions of the container 132.

Figure 1G:
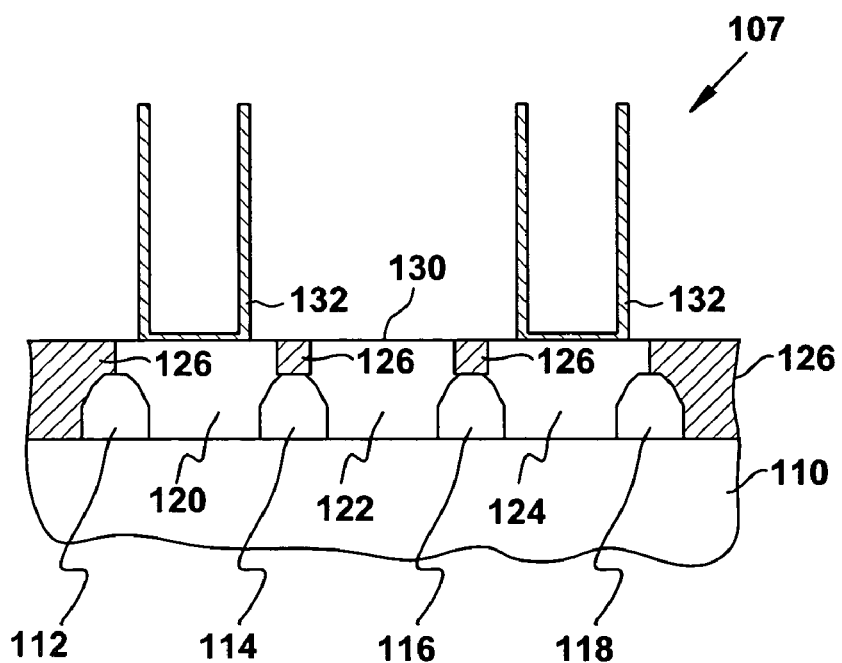
FIG. 1G is a cross section of the structure depicted in FIG. 1F after further processing.

FIG. 1G is a cross section of the structure 107 depicted in FIG. 1F after further processing. A non-wet second etch is carried out that further exposes the external surfaces of the container 132. In an embodiment, the container 132 is fully exposed, down to the upper surface 130 of the polysilicon structures, if present. The non-wet second etch is selective to the container capacitor 132 and to the upper surface 130. In an embodiment, a non-wet second rinse is carried out. The non-wet second rinse can be a plasma vapor rinse as is known conventionally.

Various combinations of the dielectric first film 138 and the sacrificial second film 140 are included as embodiments. In an embodiment, the dielectric first film 138 is an undoped oxide that etches more slowly than the sacrificial second film 140; a doped oxide such as BPSG. In an embodiment, the first etch is a wet etch that includes an HF solution, followed by a water first rinse. The non-wet second etch includes a plasma vapor etch, followed by a non-wet second rinse such as a conventional plasma vapor rinse.

FIG. 1 is a cross section of the structure 100 depicted in FIG. 1G after further processing according to an embodiment. A storage cell dielectric film 134 is disposed over the container capacitor 132. Finally as to the container capacitor structure 100, a storage cell plate 136 is disposed over the storage cell dielectric film 134. Incidental to the container capacitor structure 100, the upper dielectric stack 128 is referred to as such because of processing conditions, set forth in this disclosure.

Referring again to FIG. 1E, various embodiments are set forth for seriatim etching of the sacrificial second film 140 and the dielectric first film 138 to expose a portion of the container 132, with the added embodiments where the non-wet second etch is omitted. Compositions for the dielectric first film 138 include doped and undoped oxides, spin-on and vapor-deposited oxides, amorphous carbon, undoped polysilicon, and a lightly doped polysilicon. Compositions for the sacrificial second film 140 include doped and undoped oxides, spin-on and vapor-deposited oxides, undoped polysilicon, and a doped polysilicon.

In an embodiment, the dielectric first film 138 is a vapor-deposited, undoped oxide that etches more slowly than the sacrificial second film 140. In an embodiment, the dielectric first film 138 is a silicon oxide film that is decomposed from tetraethyl ortho silicate (TEOS). In an embodiment, the sacrificial second film 140 is a vapor-deposited, doped oxide such as borophosphosilicate glass (BPSG). In an embodiment, the sacrificial second film 140 is borosilicate glass (BSG). In an embodiment, the sacrificial second film 140 is phospho silicate glass (PSG). In an embodiment, the sacrificial second film 140 is doped polysilicon. Other conventional doped dielectric sacrificial second films can be used, in connection with the vapor-deposited undoped dielectric first film 138. Seriatim etching of the sacrificial second film 140 and the dielectric first film 138 is commenced according to an embodiment, by a first etch of the sacrificial second film 140, followed by a non-wet second etch. In an embodiment, the sacrificial second film 140 is a doped oxide that is wet first etched by a room-temperature 10:1 $H_2O$:HF solution. In an embodiment, the sacrificial second film 140 is a doped polysilicon material that is wet first etched by a room-temperature tetramethyl ammonium hydroxide (TMAH) solution that is configured to remove the doped polysilicon and that stops on the dielectric first film 138. In an embodiment, the sacrificial second film 140 is a doped polysilicon material that is plasma vapor first etched and that stops on the dielectric first film 138. After the first etch, the structure 106 (FIG. 1F) is first rinsed in deionized (DI) water, and dried by at least one of isopropyl alcohol rinse and a heated drying process. The dielectric first film 138 is non-wet second etched in a plasma etch that uses a fluoride compound. In an embodiment, the fluoride compound includes carbon tetrafluoride ($CF_4$) or carbon hexafluoride ($CF_6$). The non-wet second etch stops on the upper surface 130 (FIG. 1G). In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is a spin-on deposited, undoped oxide that etches more slowly than the sacrificial second film 140. In an embodiment, the sacrificial second film 140 is a vapor-deposited doped oxide. In an embodiment, the sacrificial second film 140 is BPSG. In an embodiment, the sacrificial second film 140 is BSG. In an embodiment, the sacrificial second film 140 is PSG. In an embodiment, the sacrificial second film 140 is doped polysilicon. Other doped sacrificial films can be used in connection with the spin-on deposited, undoped oxide dielectric first film 138. Seriatim etching of the sacrificial second film 140 and the dielectric first film 138 is commenced according to an embodiment, by a first etch of the sacrificial second film 140. In an embodiment, the sacrificial second film 140 is wet first etched by a room-temperature 10:1 H2O:HF solution when the sacrificial second film 140 is an oxide. Where the sacrificial second film 140 is a doped polysilicon, it is wet first etched by a room-temperature TMAH solution that is configured to remove the doped polysilicon and that stops on the dielectric first film 138. In an embodiment, a plasma vapor first etch is carried out on the doped polysilicon sacrificial second film 140. After the first etch, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound according to an embodiment set forth in this disclosure. The non-wet second etch stops on the upper surface 130 (FIG. 1G) according to an embodiment set forth in this disclosure. In an embodiment, a non-wet second rinse is carried out.

In an embodiment, the dielectric first film 138 is a spin-on deposited, undoped oxide that etches more slowly than the sacrificial second film 140. The sacrificial second film 140 is a spin-on deposited doped oxide. In an embodiment, the dielectric first film 138 is a silicon oxide film that is spun on, and the sacrificial second film 140 is BPSG. In an embodiment, the sacrificial second film 140 is BSG. In an embodiment, the sacrificial second film 140 is PSG. Other doped sacrificial films can be used, in connection with spin-on deposited dielectric first film 138. Seriatim etching of the sacrificial second film 140 and the dielectric first film 138 is commenced according to an embodiment, by a wet first etch of the sacrificial second film 140. In an embodiment, the sacrificial second film 140 is wet first etched by a room-temperature 10:1 $H_2O$:HF solution. Thereafter, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound. In an embodiment, the fluoride compound includes $CF_4$ or $CF_6$. The non-wet second etch stops on the upper surface 130 (FIG. 1G). In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is a vapor-deposited, undoped oxide that etches more slowly than the sacrificial second film 140. The sacrificial second film 140 is a spin-on deposited doped oxide. In an embodiment, the dielectric first film 138 is a silicon oxide film that spun on, and sacrificial second film 140 is BPSG. In an embodiment, the sacrificial second film 140 is BSG. In an embodiment, the sacrificial second film 140 is PSG. Other doped sacrificial films can be used, in connection with the vapor-deposited undoped dielectric first film 138. Seriatim etching of the sacrificial second film 140 and the dielectric first film 138 is commenced according to an embodiment, by a wet first etch of the sacrificial second film 140. In an embodiment, the sacrificial second film 140 is wet first etched by a room-temperature 10:1 $H_2O$:HF solution. Thereafter, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound. In an embodiment, the fluoride compound includes $CF_4$ or $CF_6$. The non-wet second etch stops on the upper surface 130 (FIG. 1G). In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is a deposited, amorphous carbon film. In an embodiment, the sacrificial second film 140 is a spin-on deposited doped oxide. In an embodiment, the sacrificial second film 140 is BPSG. In an embodiment, the sacrificial second film 140 is BSG. In an embodiment, the sacrificial second film 140 is PSG. In an embodiment, the sacrificial second film 140 is doped polysilicon. Other doped sacrificial films can be used, in connection with the dielectric first film 138. Seriatim etching of the sacrificial second film 140 and the dielectric first film 138 is commenced according to an embodiment, by a wet first etch of the sacrificial second film 140 when the sacrificial second film 140 is doped oxide. In an embodiment, the sacrificial second film 140 is wet first etched by a room-temperature 10:1 $H_2O$:HF solution. Where the sacrificial second film 140 is a doped polysilicon, it is wet first etched by a room-temperature TMAH solution that is configured to remove the doped polysilicon and that stops on the dielectric first film 138. In an embodiment, a plasma vapor first etch is carried out on the doped polysilicon sacrificial second film 140. After the first etch, the structure 106 (FIG. 1F) is first rinsed in DI water, and dried by at least one of isopropyl alcohol rinse and a heated drying process. Non-wet second stripping of the amorphous carbon dielectric first film 138 is carried out under plasma oxygen etching conditions in a substantially dry plasma vapor. In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is a deposited, amorphous carbon film. The sacrificial second film 140 is a vapor-deposited doped oxide. In an embodiment, the sacrificial second film 140 is BPSG. In an embodiment, the sacrificial second film 140 is BSG. In an embodiment, the sacrificial second film 140 is PSG. Other doped sacrificial films can be used, in connection with the dielectric first film 138. Etching of the sacrificial second film 140 is commenced according to an embodiment, by a wet first etch of the doped oxide sacrificial second film 140. In an embodiment, the sacrificial second film 140 is wet first etched by a room-temperature 10:1 $H_2O$:HF solution. Thereafter, the structure 106 (FIG. 1F) is first rinsed in DI water, and dried by at least one of isopropyl alcohol rinse and a heated drying process. Non-wet second stripping of the amorphous carbon dielectric first film 138 is carried out under plasma oxygen etching conditions in a substantially dry plasma vapor. In an embodiment, a non-wet second rinse is carried out.

In an embodiment, the dielectric first film 138 is a vapor-deposited, undoped oxide. In an embodiment, the sacrificial second film 140 is a vapor-deposited, undoped oxide that is substantially identical in its response to a wet etch as the dielectric first film 138. In an embodiment, the dielectric first film 138 and the sacrificial second film 140 are an integral layer that is vapor-deposited in a single process. In an embodiment, the dielectric first film 138 is a silicon oxide film that is decomposed from TEOS. In an embodiment, the sacrificial second film 140 is undoped polysilicon. Other undoped sacrificial films can be used as is known in the art, in connection with the vapor-deposited dielectric first film 138. Seriatim etching of the sacrificial second film 140 and the dielectric first film 138 is commenced according to an embodiment, by a timed wet first etch of the sacrificial second film 140. In an embodiment, the sacrificial second film 140 is wet first etched by a timed process that uses a room-temperature 10:1 $H_2O$:HF solution. Where the sacrificial second film 140 is an undoped polysilicon, it is wet first etched by a room-temperature TMAH solution that is configured to remove the doped polysilicon and that stops on the dielectric first film 138. In an embodiment, a plasma vapor first etch is carried out on the undoped polysilicon sacrificial second film 140. In an embodiment, removal of the sacrificial second film 140, amounts to about one-fifth the total depth from the top surface 150, measured to the upper surface 130. In an embodiment, removal of the sacrificial second film 140, amounts to about one-fourth the total depth. In an embodiment, removal of the sacrificial second film 140, amounts to about one-third the total depth. In an embodiment, removal of the sacrificial second film 140, amounts to about one-half the total depth. In an embodiment, removal of the sacrificial second film 140, amounts to about three-fifths the total depth. In an embodiment, removal of the sacrificial second film 140, amounts to about three-fourths the total depth. In an embodiment, removal of the sacrificial second film 140, amounts to about four-fifths the total depth. After the first etch, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound according to embodiments set forth in this disclosure. The non-wet second etch stops on the upper surface 130 (FIG. 1G) according to embodiments set forth in this disclosure. In an embodiment, a non-wet second rinse is carried out.

In an embodiment, the dielectric first film 138 is a vapor-deposited, undoped oxide that etches differently than the sacrificial second film 140. The sacrificial second film 140 is a spin-on deposited undoped oxide. In an embodiment, the sacrificial second film 140 is silicon oxide. Other undoped sacrificial films can be used, in connection with spin-on deposited dielectric first film 138. Seriatim etching of the sacrificial second film 140 and the dielectric first film 138 is commenced according to an embodiment, by a timed wet first etch of the sacrificial second film 140. In an embodiment, the sacrificial second film 140 is wet first etched by timed a room-temperature 10:1 $H_2O$:HF solution. Thereafter, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound according to an embodiment set forth in this disclosure. The non-wet second etch stops on the upper surface 130 (FIG. 1G) according to an embodiment set forth in this disclosure. In an embodiment, a non-wet second rinse is carried out.

In an embodiment, the dielectric first film 138 is a spin-on deposited, undoped oxide. In an embodiment he sacrificial second film 140 is also a spin-on deposited undoped oxide that is substantially identical in its response to a wet etch as the dielectric first film 138. In an embodiment, the dielectric first film 138 is a silicon oxide film, as well as the sacrificial second film 140. In an embodiment, the dielectric first film 138 and the sacrificial second film 140 are an integral layer that is spin-on deposited in a single process. In an embodiment, the sacrificial second film 140 is an undoped polysilicon. Other conventional undoped sacrificial films can be used, in connection with the spin-on deposited dielectric first film 138. Seriatim etching of the sacrificial second film 140 and the dielectric first film 138 is commenced according to an embodiment, by a timed wet first etch of the sacrificial second film 140 when the sacrificial second film 140 is an undoped oxide. In an embodiment, the sacrificial second film 140 is wet first etched by a room-temperature 10:1 $H_2O$:HF solution. Where the sacrificial second film 140 is an undoped polysilicon, it is wet first etched by a room-temperature TMAH solution that is configured to remove the doped polysilicon and that stops on the dielectric first film 138. In an embodiment, a plasma vapor first etch is carried out on the undoped polysilicon sacrificial second film 140. After the first etch, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound. In an embodiment, the fluoride compound includes $CF_4$ or $CF_6$. The non-wet second etch stops on the upper surface 130 (FIG. 1G). In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is a spin-on deposited, undoped oxide. The sacrificial second film 140 is a vapor-deposited undoped oxide. In an embodiment, the dielectric first film 138 is a silicon oxide film, as well as the sacrificial second film 140. In an embodiment, the dielectric first film 138 is a silicon oxide film that is decomposed from TEOS. Other undoped sacrificial films can be used as is known in the art, in connection with the vapor-deposited dielectric first film 138. Seriatim etching of the sacrificial second film 140 and the dielectric first film 138 is commenced according to an embodiment, by a wet first etch of the sacrificial second film 140. In an embodiment, the sacrificial second film 140 is wet first etched by a room-temperature 10:1 $H_2O:HF$ solution. Thereafter, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound. In an embodiment, the fluoride compound includes $CF_4$ or $CF_6$. The non-wet second etch stops on the upper surface 130 (FIG. 1G). In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is a deposited, amorphous carbon film. In an embodiment, the sacrificial second film 140 is a spin-on deposited undoped oxide. In an embodiment, the sacrificial second film 140 is silicon oxide. In an embodiment, the sacrificial second film 140 is undoped polysilicon. Other undoped sacrificial films can be used as is known in the art, in connection with the dielectric first film 138. Seriatim etching of the sacrificial second film 140 and the dielectric first film 138 is commenced according to an embodiment, by a wet first etch of the sacrificial second film 140 when the sacrificial second film 140 is undoped oxide. In an embodiment, the sacrificial second film 140 is wet first etched by a room-temperature 10:1 $H_2O:HF$ solution. Where the sacrificial second film 140 is an undoped polysilicon, it is wet first etched by a room-temperature TMAH solution that is configured to remove the doped polysilicon and that stops on the dielectric first film 138. In an embodiment, a plasma vapor first etch is carried out on the undoped polysilicon sacrificial second film 140. After the first etch, the structure 106 (FIG. 1F) is first rinsed in DI water, and dried by at least one of isopropyl alcohol rinse and a heated drying process. Non-wet second stripping of the amorphous carbon dielectric first film 138 is carried out under plasma oxygen etching conditions in a substantially dry plasma vapor. In an embodiment, a non-wet second rinse is carried out.

In an embodiment, the dielectric first film 138 is a deposited, amorphous carbon film. The sacrificial second film 140 is a vapor-deposited undoped oxide. In an embodiment, the sacrificial second film 140 is silicon oxide. Other conventional undoped sacrificial films can be used in connection with the dielectric first film 138. Seriatim etching of the sacrificial second film 140 and the undoped dielectric first film 138 is commenced according to an embodiment, by a wet first etch of the sacrificial second film 140. In an embodiment, the sacrificial second film 140 is wet first etched by a room-temperature 10:1 $H_2O:HF$ solution. Thereafter, the structure 106 (FIG. 1F) is first rinsed in DI water, and dried by at least one of isopropyl alcohol rinse and a heated drying process. Non-wet second stripping of the amorphous carbon dielectric first film 138 is carried out under plasma oxygen etching conditions in a substantially dry plasma vapor. The non-wet second etch stops on the upper surface 130 (FIG. 1G). In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is a vapor-deposited, doped oxide that etches differently than the sacrificial second film 140. In an embodiment, the sacrificial second film 140 is a vapor-deposited, doped oxide. In an embodiment, the sacrificial second film 140 is a doped polysilicon. In an embodiment, the dielectric first film 138 is a doped silicon oxide film and the sacrificial second film 140 is a similarly doped silicon oxide film. In an embodiment, the dielectric first film 138 is a doped silicon oxide film and the sacrificial second film 140 is a differently doped silicon oxide film. In an embodiment, the dielectric first film 138 is BPSG, and the sacrificial second film 140 is BPSG with a lower doping concentration than the dielectric first film 138. In an embodiment, the dielectric first film 138 is PSG, and the sacrificial second film 140 is PSG with a lower doping concentration than the dielectric first film 138. In an embodiment, the dielectric first film 138 is BSG, and the sacrificial second film 140 is BSG with a lower doping concentration than the dielectric first film 138. In an embodiment, the dielectric first film 138 is BPSG, and the sacrificial second film 140 is a doped oxide that is not BPSG. In an embodiment, the dielectric first film 138 is PSG, and the sacrificial second film 140 is a doped oxide that is not PSG. In an embodiment, the dielectric first film 138 is BSG, and the sacrificial second film 140 is a doped oxide that is not BSG. In an embodiment, the sacrificial second film 140 is a doped polysilicon. Other doped dielectric combinations are used also, that includes a faster etch response for the sacrificial second film 140 with respect to the etch response of the dielectric first film 138. Seriatim etching of the doped sacrificial second film 140 and the dielectric first film 138 is commenced according to an embodiment, by a timed wet first etch of the sacrificial second film 140 when the sacrificial second film 140 is an oxide. In an embodiment, the sacrificial second film 140 is wet first etched by a timed process that uses a room-temperature 10:1 $H_2O:HF$ solution. Where the sacrificial second film 140 is a doped polysilicon, it is wet first etched by a room-temperature TMAH solution that is configured to remove the doped polysilicon and that stops on the dielectric first film 138. In an embodiment, a plasma vapor first etch is carried out on the doped polysilicon sacrificial second film 140. In an embodiment, removal of the sacrificial second film 140, amounts to about one-fifth the total depth from the top surface 150, measured to the upper surface 130. In an embodiment, removal of the sacrificial second film 140, amounts to about one-fourth the total depth. In an embodiment, removal of the sacrificial second film 140, amounts to about one-third the total depth. In an embodiment, removal of the sacrificial second film 140, amounts to about one-half the total depth. In an embodiment, removal of the sacrificial second film 140, amounts to about three-fifths the total depth. In an embodiment, removal of the sacrificial second film 140, amounts to about three-fourths the total depth. In an embodiment, removal of the sacrificial second film 140, amounts to about four-fifths the total depth. After the first etch, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound according to embodiments set forth in this disclosure. The non-wet second etch stops on the upper surface 130 (FIG. 1G) according to embodiments set forth in this disclosure. In an embodiment, a non-wet second rinse is carried out.

In an embodiment, the dielectric first film 138 is a spin-on deposited, doped oxide that etches differently than the sacrificial second film 140. In an embodiment, the sacrificial second film 140 is a vapor-deposited doped oxide. In an embodiment, the sacrificial second film 140 is BPSG, and the dielectric first film 138 is one of a differently doped BPSG or a non-BPSG. In an embodiment, the sacrificial second film 140 is BSG, and the dielectric first film 138 is one of a differently doped BSG or a non-BSG. In an embodiment, the sacrificial second film 140 is PSG, and the dielectric first film 138 is one of a differently doped PSG or a non-PSG. In an embodiment, the sacrificial second film 140 is doped polysilicon. Other doped sacrificial films can be used, in connection with the doped, spin-on deposited dielectric first film 138. Seriatim etching of the sacrificial second film 140 and the dielectric first film 138 is commenced according to an embodiment, by a wet first etch of the sacrificial second film 140 when the sacrificial second film 140 is an oxide. In an embodiment, the sacrificial second film 140 is wet first etched by a room-temperature 10:1 $H_2O$:HF solution. Where the sacrificial second film 140 is a doped polysilicon, it is wet first etched by a room-temperature TMAH solution that is configured to remove the doped polysilicon and that stops on the dielectric first film 138. In an embodiment, a plasma vapor first etch is carried out on the doped polysilicon sacrificial second film 140. After the first etch, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound according to an embodiment set forth in this disclosure. The non-wet second etch stops on the upper surface 130 (FIG. 1G) according to an embodiment set forth in this disclosure. In an embodiment, a non-wet second rinse is carried out.

In an embodiment, the dielectric first film 138 is a spin-on deposited, doped oxide. The sacrificial second film 140 is also a spin-on deposited doped oxide that is substantially identical in its response to a wet etch as the dielectric first film 138. In an embodiment, the dielectric first film 138 is a silicon oxide film that is spun on, the sacrificial second film 140 is BPSG, and the dielectric first film 138 is one of a differently doped BPSG or a non-BPSG. In an embodiment, the sacrificial second film 140 is BSG, and the dielectric first film 138 is one of a differently doped BSG or a non-BSG. In an embodiment, the sacrificial second film 140 is PSG, and the dielectric first film 138 is one of a differently doped PSG or a non-PSG. Other doped sacrificial films can be used, in connection with the spin-on deposited dielectric first film 138. Seriatim etching of the sacrificial second film 140 and the dielectric first film 138 is commenced according to an embodiment, by a wet first etch of the sacrificial second film 140. In an embodiment, the sacrificial second film 140 is wet first etched by a room-temperature 10:1 $H_2O$:HF solution. Thereafter, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound according to an embodiment set forth in this disclosure. The non-wet second etch stops on the upper surface 130 (FIG. 1G) according to an embodiment set forth in this disclosure. In an embodiment, a non-wet second rinse is carried out.

In an embodiment, the dielectric first film 138 is a vapor-deposited, doped oxide. The sacrificial second film 140 is a vapor-deposited doped oxide. In an embodiment, the dielectric first film 138 is a doped silicon oxide film that is vapor deposited, sacrificial second film 140 is BPSG, and the dielectric first film 138 is one of a differently doped BPSG or a non-BPSG. In an embodiment, the sacrificial second film 140 is BSG, and the dielectric first film 138 is one of a differently doped BSG or a non-BSG. In an embodiment, the sacrificial second film 140 is PSG, and the dielectric first film 138 is one of a differently doped PSG or a non-PSG. Other doped sacrificial films can be used, in connection with the vapor-deposited dielectric first film 138. Seriatim etching of the sacrificial second film 140 and the dielectric first film 138 is commenced according to an embodiment, by a wet first etch of the sacrificial second film 140. In an embodiment, the sacrificial second film 140 is wet first etched by a room-temperature 10:1 $H_2O$:HF solution. Thereafter, the structure 106 (FIG. 1F) is first rinsed in DI water, and dried by at least one of isopropyl alcohol rinse and a heated drying process. The dielectric first film 138 is next non-wet second etched in a plasma etch that uses a fluoride compound. In an embodiment, the fluoride compound includes $CF_4$ or $CF_6$. The non-wet second etch stops on the upper surface 130 (FIG. 1G). In an embodiment, the upper surface 130 is covered with an etch-stop film (see first barrier film 436 or second barrier film 438, FIG. 4, for example) such as a metal or a metal nitride. In an embodiment, a non-wet second rinse is carried out.

In an embodiment, the dielectric first film 138 is an undoped polysilicon that etches differently than the sacrificial second film 140. The sacrificial second film 140 is a doped polysilicon. Other doped sacrificial films can be used, in connection with the undoped polysilicon first film 138. Seriatim etching of the doped sacrificial second film 140 and the undoped polysilicon first film 138 is commenced according to an embodiment by a wet first etch with a room-temperature TMAH solution that is configured to remove the doped polysilicon 140 and that stops on the undoped polysilicon first film 138. In an embodiment, a plasma vapor first etch is carried out on the doped polysilicon sacrificial second film 140. After the first etch, the structure 106 (FIG. 1F) is first rinsed in DI water, and dried by at least one of isopropyl alcohol rinse and a heated drying process. The polysilicon first film 138 is next non-wet second etched in a plasma etch that is conventional for undoped polysilicon, or according to an embodiment set forth in this disclosure. The non-wet second etch stops on the upper surface 130 (FIG. 1G) according to an embodiment set forth in this disclosure. In an embodiment, a non-wet second rinse is carried out.

In an embodiment, the dielectric first film 138 is a lightly doped polysilicon that etches differently than the sacrificial second film 140. The sacrificial second film 140 is a doped polysilicon that is heavier-doped (i.e. "heavily doped polysilicon" in relative terms), at least one of differently doped in type or in quantity. Other doped sacrificial films can be used, in connection with the lightly doped polysilicon first film 138. Seriatim etching of the sacrificial second film 140 and the lightly doped polysilicon first film 138 is commenced according to an embodiment by a wet first etch with a room-temperature TMAH solution that is configured to remove the heavier-doped polysilicon 140 and that stops on the lightly doped polysilicon first film 138. In an embodiment, a plasma vapor first etch is carried out on the heavier-doped polysilicon sacrificial second film 140. After the first etch, the structure 106 (FIG. 1F) is first rinsed in DI water, and dried by at least one of isopropyl alcohol rinse and a heated drying process. The polysilicon first film 138 is next non-wet second etched in a plasma etch that is conventional for undoped polysilicon according to an embodiment set forth in this disclosure. The non-wet second etch stops on the upper surface 130 (FIG. 1G) according to an embodiment set forth in this disclosure. In an embodiment, a non-wet second rinse is carried out.

Figure 2:
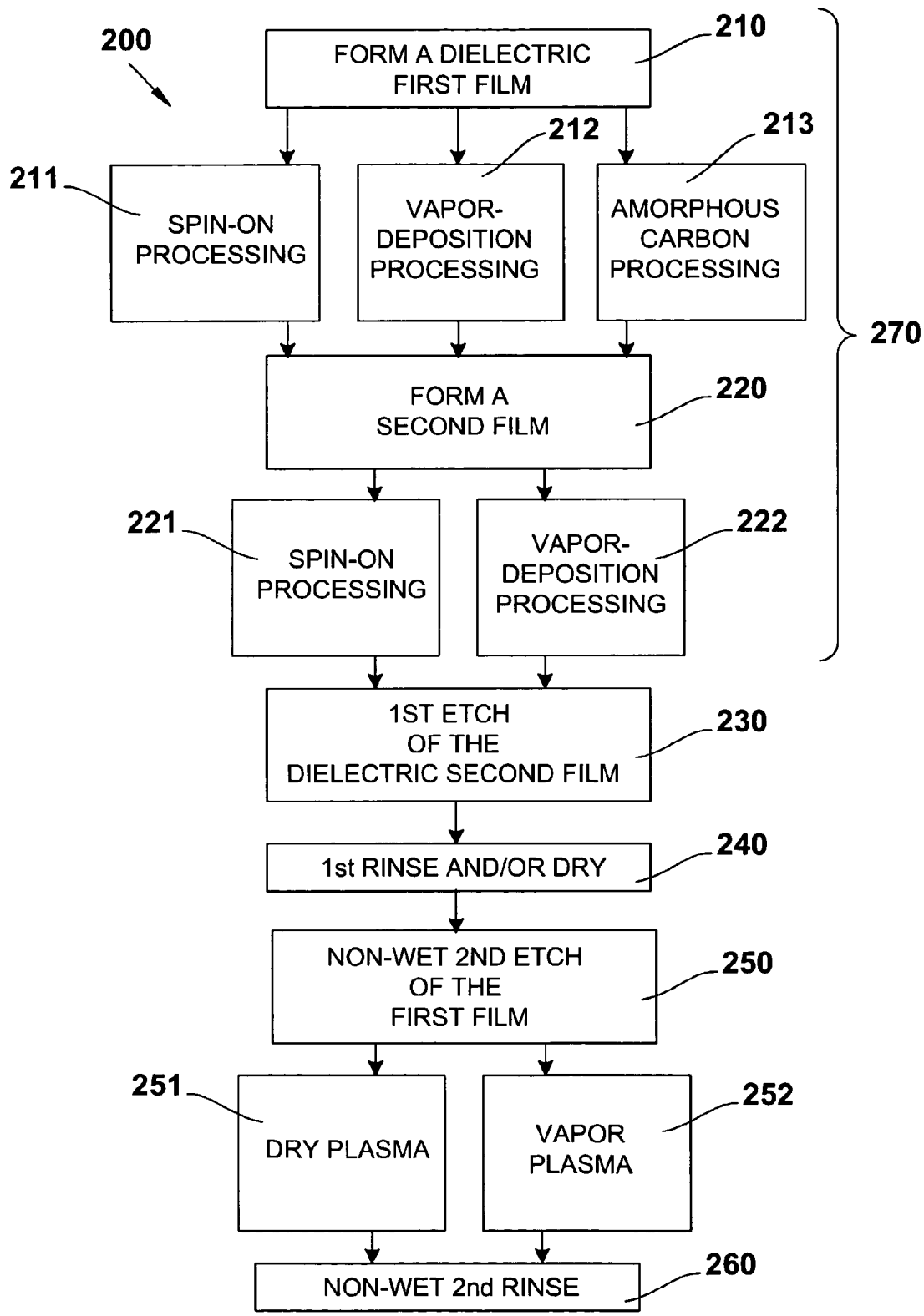
FIG. 2 is a process flow diagram that illustrates various exemplary process embodiments that relate to FIGS. 1, 1A, 1B, 1C, 1D, 1E, 1F, and 1G.

FIG. 2 is a process flow diagram 200 that illustrates various exemplary process embodiments that relate to FIGS. 1, 1A, 1B, 1C, 1D, 1E, 1F, and 1G. At 210 the process includes forming a dielectric first film. By way of non-limiting example, a dielectric first film 138 is formed. The dielectric first film is formed according to one of three process paths. At 211, the dielectric first film is formed by spin-on deposition according to the various embodiments set forth in this disclosure. At 212, the dielectric first film is formed by vapor deposition according to the various embodiments set forth in this disclosure. At 213, the dielectric first film is formed by amorphous carbon deposition according to the various embodiments set forth in this disclosure. Where the first film is polysilicon, however, the process path relates to a vapor-deposition action such as CVD of the first film.

At 220, the process flow includes forming a sacrificial second film. By way of non-limiting example, a sacrificial second film 140 is formed. The sacrificial second film is formed according to one of two process paths. At 221, the second film is formed by spin-on deposition according to the various embodiments set forth in this disclosure. At 222, the sacrificial second film is formed by vapor deposition according to the various embodiments set forth in this disclosure.

At 230, the process flow includes etching of the sacrificial second film. By way of non-limiting example, a sacrificial second film 140 is wet first etched.

At 240, the process flow includes wet first rinsing and optionally drying the structure. Because the dielectric first film still embeds the container capacitor, sufficient structural integrity remains in the structure to prevent damage to the container capacitor.

At 250, the process flow includes non-wet second etching of the dielectric first film. By way of non-limiting example, a first film 138 is non-wet etched. At 251, the non-wet etch is a dry plasma. In an embodiment, the dry plasma is a fluorine-based plasma etch. In an embodiment, the dry plasma is an oxygen-based plasma etch. At 252 the non-wet etch is a vapor plasma etch. In an embodiment, the vapor plasma is a fluorine-based plasma etch.

At 260, a non-wet second rinse is carried out.

In an embodiment, the first film and the sacrificial second film constitute a single, integral film. At 270, the process flow includes forming the single, integral film that is similar in depth as the first film and the sacrificial second film. Accordingly, first etching and second etching as set forth in FIG. 2, includes a timed, wet first etch and a non-wet second etch. Details of this embodiment are set forth in FIGS. 3 through 3G.

Figure 3:
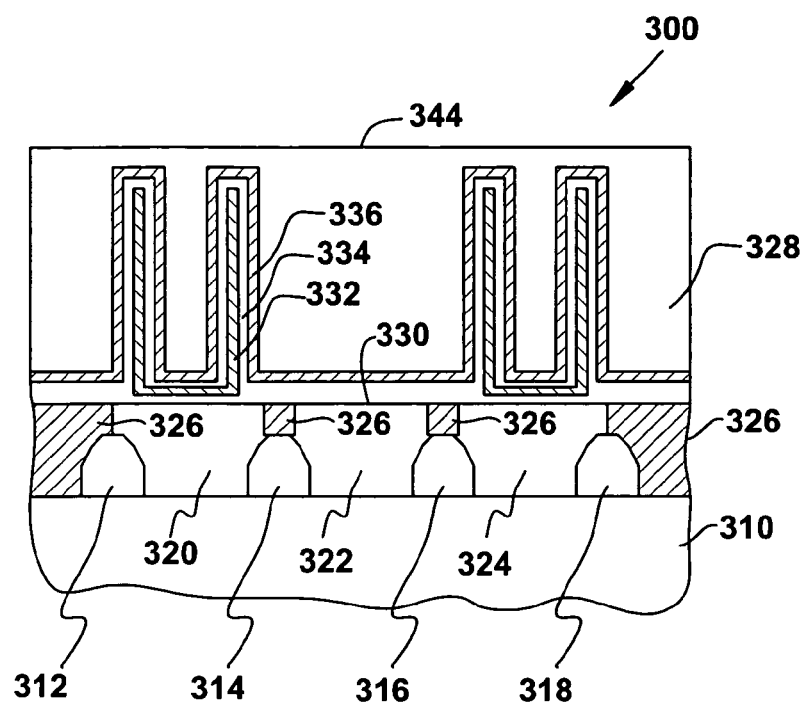
FIG. 3 is a cross section of another container capacitor structure according to an embodiment.

FIG. 3 is a cross section of another container capacitor structure according to an embodiment. A substrate 310 includes an active area (not pictured) and a series of gate stacks 312, 314, 316, and 318. The container in the container capacitor structure is electrically coupled to the substrate 310. Between the gate stacks 312 and 314 is a first cell landing pad 320. Between the gate stacks 314 and 316 is a digit line landing pad 322. And between the gate stacks 316 and 318 is a second cell landing pad 324. By way of non-limiting example, the cell landing pads 320, 324 and the digit line landing pad 322 are isolated from each other by a dielectric 326.

An upper dielectric stack 328 is disposed above an upper surface 330 of the cell landing pads 320, 324 and the digit line landing pad 322. Container capacitors 332 are disposed upon the first cell landing pad 320 and the second cell landing pad 324. A storage cell dielectric film 334 is disposed over the container capacitor 332. Finally as to the container capacitor structure 300, a storage cell plate 336 is disposed over the storage cell dielectric film 334. Incidental to the container capacitor structure 300, the upper dielectric stack 328 is referred to as such because of processing conditions, set forth below.

FIG. 3 illustrates a two-cell container capacitor structure 300 that is similar in structure to the container capacitor structure 100 depicted in FIG. 1.

Figure 3A:
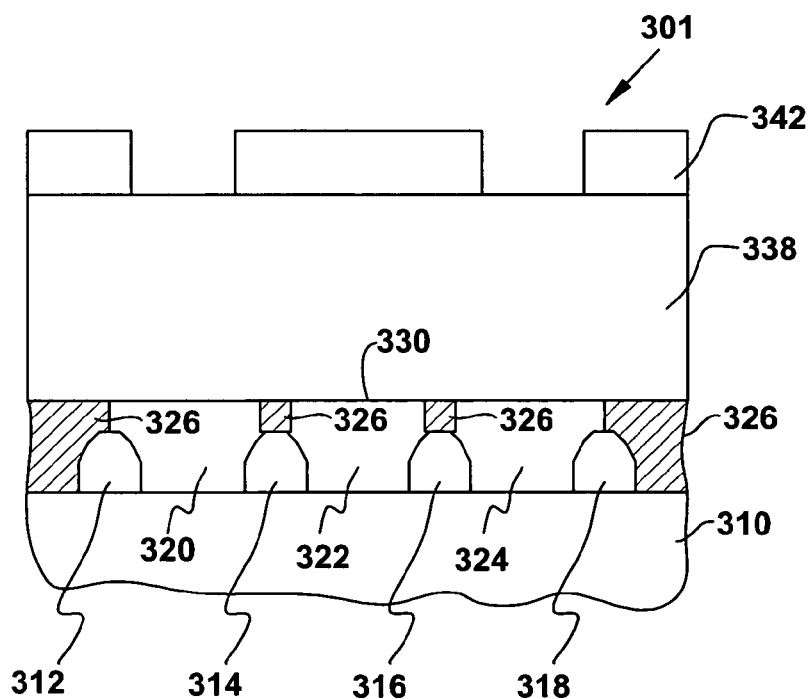
FIG. 3A is a cross section of the container capacitor structure depicted in FIG. 3 during processing according to an embodiment.

FIG. 3A is a cross section of the container capacitor structure 301 during processing according to an embodiment. The structure 301 is subjected to various processes to arrive at the container capacitor structure 300 depicted in FIG. 3. In an embodiment, the upper surface 330 has been formed after an etch-and-poly-fill process. The etch-and-poly-fill process has resulted in the first cell landing pad 320, the digit line landing pad 322, and the second cell landing pad 324. In an embodiment, the upper surface is achieved by a CMP process. In an embodiment, the polysilicon precursor material for the landing pads is an n-doped polysilicon that can be in situ doped during a CVD process. In an embodiment, the polysilicon precursor material for the landing pads is a p-doped polysilicon that can be in situ doped during a CVD process. In an embodiment, however, the polysilicon landing pads are not present, and the formation of a container recess bottoms out at the substrate 310.

In an embodiment, a dielectric first film 338 is disposed over the upper surface 330. Thereafter, a mask 342 is disposed and patterned directly above the first cell landing pad 320 and the second cell landing pad 324.

Figure 3B:
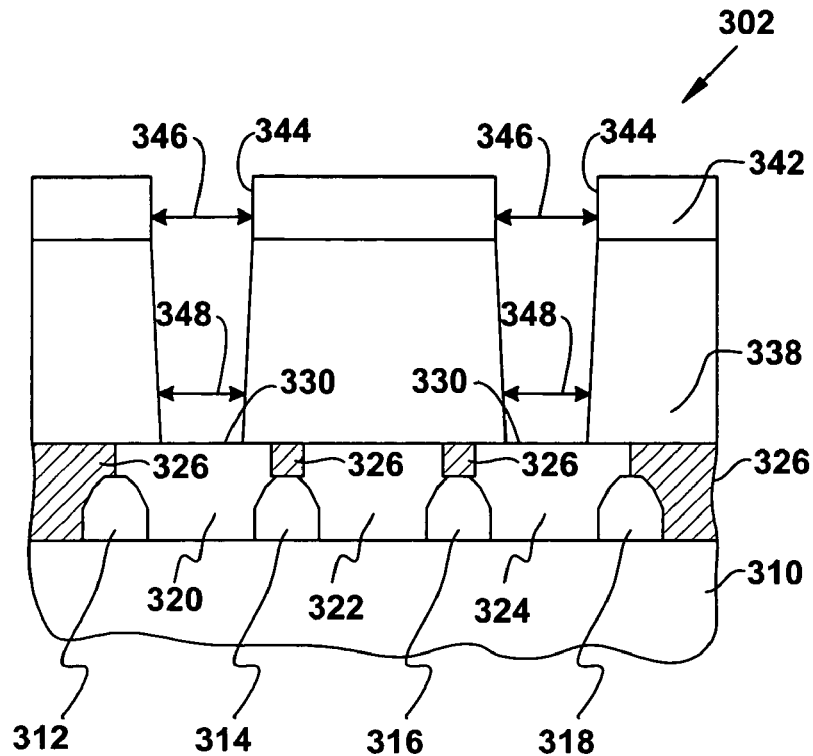
FIG. 3B is a cross section of the structure depicted in FIG. 3A after further processing.

FIG. 3B is a cross section of the structure 302 depicted in FIG. 3A after further processing. The container capacitor structure 302 has been etched to form a first recess 344 that exposes the upper surface 330. Because of the etch process, the first recess 344 is tapered to include a first characteristic dimension 346 at or near the top of the first recess 344, and a second, smaller characteristic dimension 348 at or near the bottom of the first recess 344.

In an embodiment where the first recess 344 is used to form a container capacitor, the tapered profile is adjusted to create a stronger container at the upper surface 330, and to increase the surface area of the capacitor. An embodiment provides for profile straightening of the first recess 344.

The profile straightening can be ascertained in U.S. Pat. No. 6,531,728 to DeBoer et el., which is incorporated herein by reference.

Figure 3C:
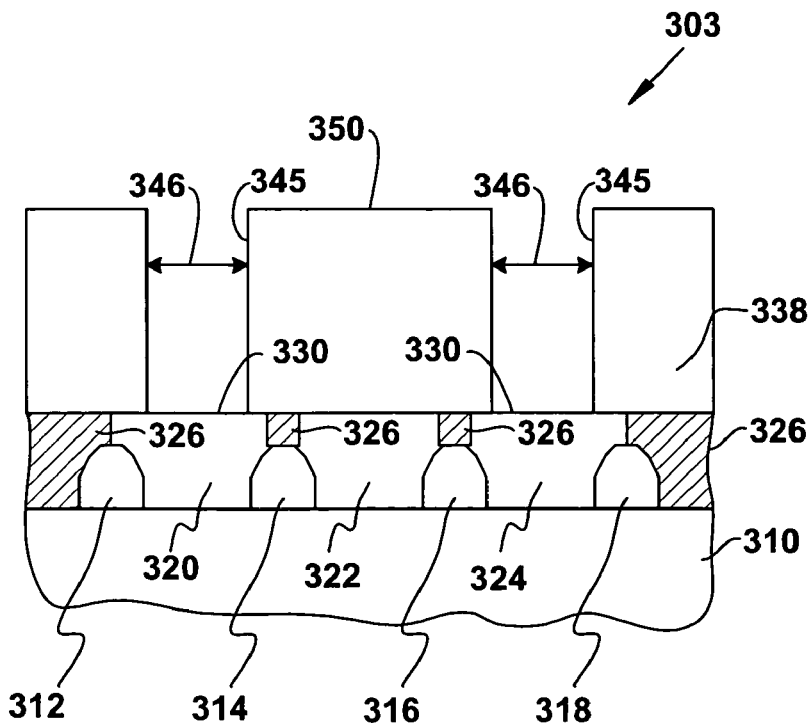
FIG. 3C is a cross section of the structure depicted in FIG. 3B after further processing.

FIG. 3C is a cross section of the structure 303 depicted in FIG. 3B after further processing. The profile straightening has achieved a second recess 345 that is significantly less tapered, if at all, than the first recess 344 depicted in FIG. 3B.

After profile straightening, the second recess 345 is ready to receive a conductive film that will act as the bottom electrode in a container capacitor according to an embodiment. The aspect ratio of the second recess 345 is the ratio of the height of the second recess 345 from the top surface 350 of the dielectric film 338 to the bottom of the second recess 345, divided by the first characteristic dimension 346 of the second recess 345. In an embodiment, the aspect ratio is in a range from about 0.5:1 to about 25:1. In an embodiment, the aspect ratio is in a range from about 1:1 to about 20:1. In an embodiment, the aspect ratio is in a range from about 2:1 to about 15:1. In an embodiment, the aspect ratio is in a range from about 5:1 to about 10:1. In an embodiment, the aspect ratio is in a range from about 6:1 to about 9:1.

Figure 3D:
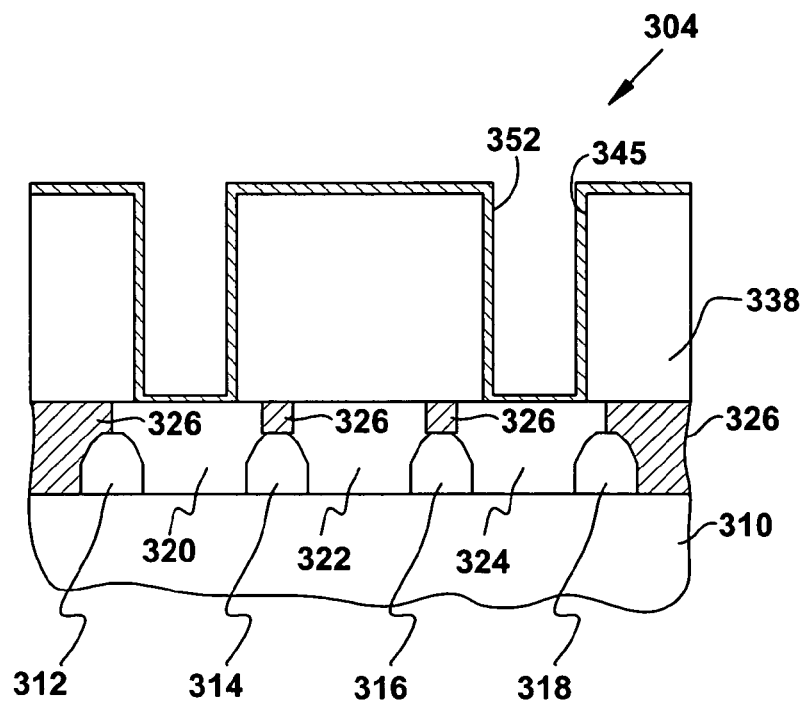
FIG. 3D is a cross section of the structure depicted in FIG. 3C after further processing.

FIG. 3D is a cross section of the structure 304 depicted in FIG. 3C after further processing. A conductive film 352 has been formed in the second recess 345 by a deposition process. In an embodiment, the conductive film 352 is a doped polysilicon that is formed by CVD under conditions that achieve a deposited film at the upper surface 330 if present, or at the bottom of the second recess 345. In an embodiment, the conductive film 352 is a metal nitride that is conductive enough for a bottom electrode of a container capacitor. In an embodiment, the conductive film 352 is a metal. In an embodiment, the conductive film 352 is an alloy. In an embodiment, the conductive film 352 is a metal/metal nitride composite such as a titanium/titanium nitride composite. Each of these conductive film embodiments is applicable to be formed in each embodiment of the first recess 344 or of the second recess 345. Accordingly, the recess in general is any of the dielectric first film 338 permutations set forth in this disclosure.

Figure 3E:
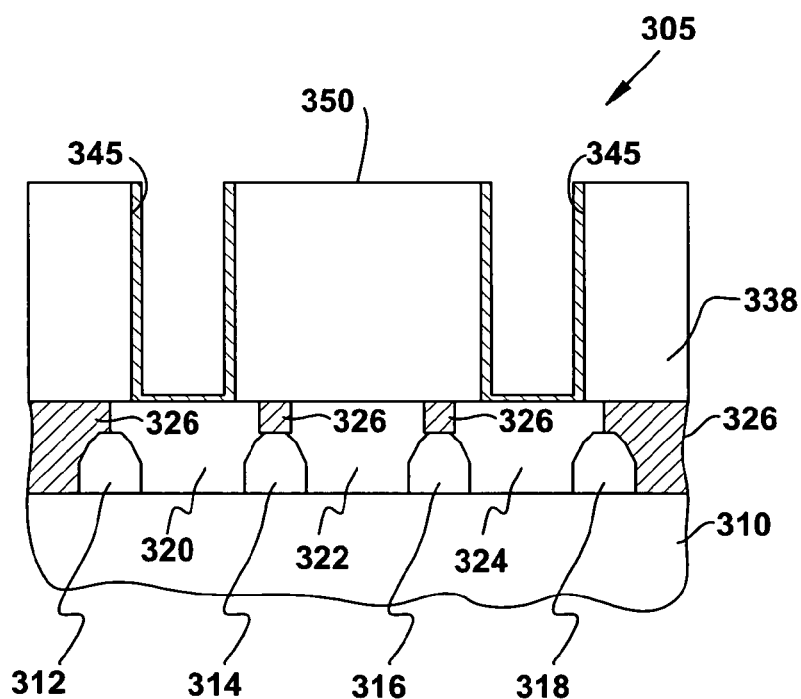
FIG. 3E is a cross section of the structure depicted in FIG. 3D after further processing.

FIG. 3E is a cross section of the structure 305 depicted in FIG. 1D after further processing. A planarization process is carried out to break the continuity of the conductive film 352 (FIG. 3D) to form the isolated containers that make up the container capacitors 332. In an embodiment, planarization is preceded by a process that fills the second recess 345 such as with a photoresist material. In an embodiment, planarization is a CMP process that stops on the upper surface 350 of the sacrificial second film. In an embodiment with the second recess 345 filled with a dummy material such as a photoresist, planarization is a chemical etchback process that stops on the upper surface 350 of the dielectric first film 338 is carried out under wet etch conditions that are rapid, and that stop on the dielectric first film 338.

Figure 3F:
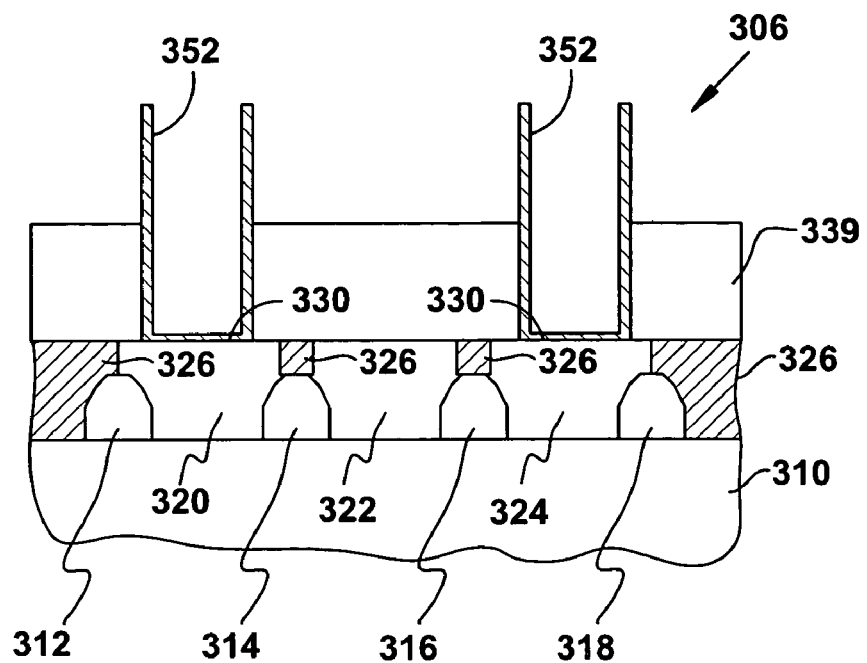
FIG. 3F is a cross section of the structure depicted in FIG. 3E after further processing.

FIG. 3F is a cross section of the structure 306 depicted in FIG. 3E after further processing. Removal of portion of the dielectric film 338 (FIG. 3E) is carried out under conditions of a timed wet etch followed by a rinse. The timed wet etch stops to leave a last portion of the dielectric film 339, which is a remnant of the dielectric film 338. Further, the timed wet etch is selective to leaving the container capacitor 332, and the rinse is carried out with the container capacitor 332 sufficiently anchored in the last portion of the dielectric film 339 that surface tension in the rinse liquid is not sufficient to damage the container capacitor 332. The amount of the last portion of the dielectric film 339 that is left after the timed wet etch can vary. In an embodiment, the amount of the last portion of the dielectric film 339 can be any one of the total etch depths that are set forth in this disclosure, including from about one-fifth or shallower to about four-fifths or deeper. In an embodiment, the process omits the non-wet second etch and the structure 300 includes the container 332 still embedded in the last portion of the dielectric film 339, with the storage cell dielectric film 334 and the storage cell plate 336 disposed over the last portion of the dielectric film 339 (not pictured in FIG. 3) and over the container 332. Consequently, the structure 300 would appear as it does in FIG. 3, with the addition, however, that the last portion of the dielectric film 339 would lie upon the upper surface 330 and abut the lower portions of the container 332.

Figure 3G:
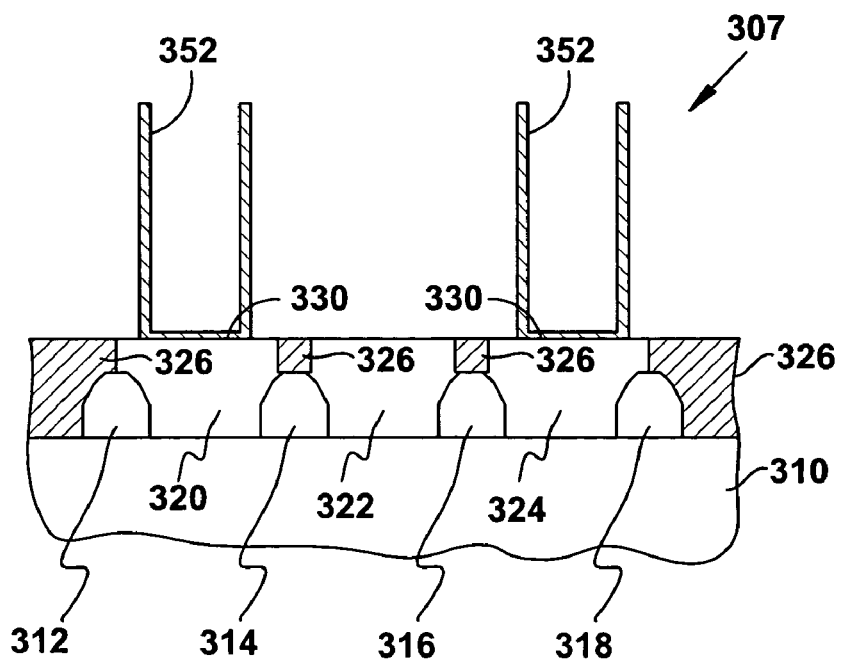
FIG. 3G is a cross section of the structure depicted in FIG. 3F after further processing.

FIG. 3G is a cross section of the structure 307 depicted in FIG. 3F after further processing. In an embodiment, a non-wet second etch is carried out that further exposes the external surfaces of the container capacitor 332. In an embodiment, the container capacitor 332 is fully exposed, down to the upper surface 330 of the polysilicon structures, if present. The non-wet second etch is selective to the container capacitor 332 and to the upper surface 330.

Referring again to FIG. 3E, various embodiments are set forth for seriatim etching of the dielectric first film 338 to expose a portion of the container 332, with the added embodiments where the non-wet second etch is omitted.

In an embodiment, the dielectric first film 338 is a spin-on deposited, undoped oxide. In an embodiment, the dielectric first film 338 is a silicon oxide film that is spun on. Other undoped sacrificial films can be used as is known in the art, in connection with the spin-on deposited dielectric first film 338, which is to be non-wet second etched after formation of the last portion of the dielectric film 339 according to any of the various embodiments. Seriatim etching of the dielectric first film 338 and the last portion of the dielectric film 339, is commenced by a wet HF etch, followed by an anhydrous HF plasma vapor etch. The anhydrous (non-wet) second etch stops on the upper surface 130 (FIG. 3G) according to an embodiment set forth in this disclosure. In an embodiment, a non-wet second rinse is carried out.

In an embodiment, the dielectric first film 338 is a spin-on deposited, doped oxide. In an embodiment, the dielectric first film 338 is a silicon oxide film that is spun on. Other doped sacrificial films can be used, in connection with the spin-on deposited dielectric first film 338, which is to be non-wet second etched. Seriatim etching of the dielectric first film 338 and the last portion of the dielectric film 339 is commenced according to an embodiment, by a timed, wet first etch of the dielectric first film 338. In an embodiment, the dielectric first film 338 is wet first etched by a room-temperature 10:1 H$_2$O: HF solution. Thereafter, the structure 306 is rinsed in DI water, and dried by at least one of isopropyl alcohol rinse and a heated drying process. The dielectric film 339 is next non-wet second etched in a plasma etch that uses a fluoride compound according to an embodiment set forth in this disclosure. The non-wet second etch stops on the upper surface 330 according to an embodiment set forth in this disclosure. In an embodiment, a non-wet second rinse is carried out.

FIG. 3 is a cross section of the structure 300 depicted in FIG. 3G after further processing according to an embodiment. A storage cell dielectric film 334 is disposed over the container capacitor 332. Finally as to the container capacitor structure 300, a storage cell plate 336 is disposed over the storage cell dielectric film 334. Incidental to the container capacitor structure 300, the upper dielectric stack 328 is referred to as such because of processing conditions, set forth in this disclosure.

Figure 4:
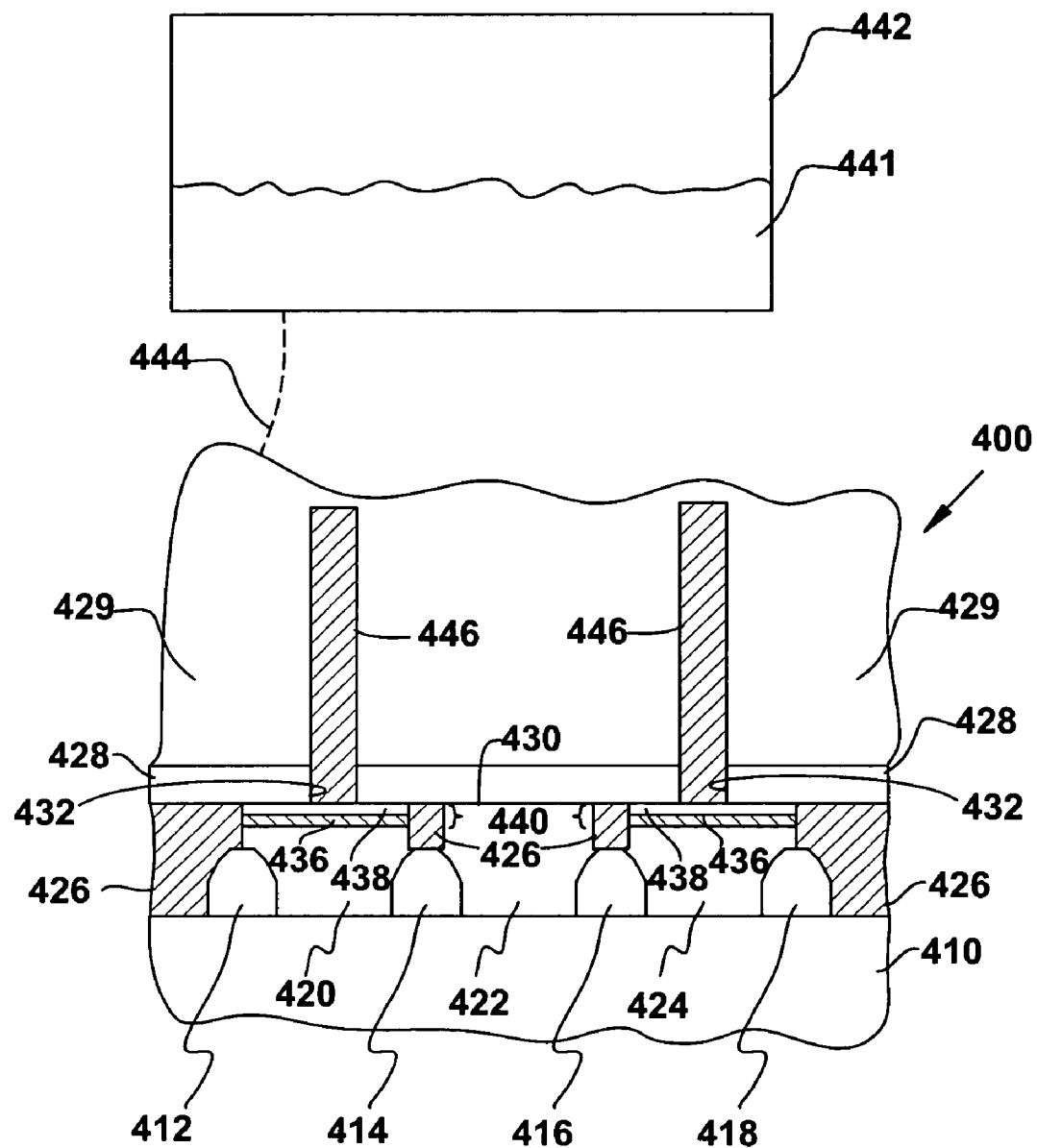
FIG. 4 is a cross section of a stud capacitor structure as part of an intermediate system according to an embodiment.

FIG. 4 is a cross section of a stud capacitor structure in an intermediate system according to an embodiment. Although a stud capacitor structure is depicted as part of an intermediate system during processing, any other structure that is to be exposed, such as any of the container capacitor structures in this disclosure, can be substituted in place of the stud structure.

A substrate 410 includes an active area (not pictured) and a series of gate stacks 412, 414, 416, and 418. The stud in the container stud capacitor structure is electrically coupled to the substrate 410. Between the gate stacks 412 and 414 is a first cell landing pad 420. Between the gate stacks 414 and 416 is a digit line landing pad 422. And between the gate stacks 416 and 418 is a second cell landing pad 424. By way of non-limiting example, the cell landing pads 420, 424 and the digit line landing pad 422 are isolated from each other by a dielectric 426.

A dielectric first film 428 is disposed above an upper surface 430 of the cell landing pads 420, 424 and the digit line landing pad 422. A contact corridor 432 is disposed in the dielectric first film 428. In an embodiment, a first barrier film 436 is disposed in immediate contact with the first cell landing pad 420 and the second cell landing pad 424. In an embodiment, a second barrier film 438 is disposed in immediate contact with the first barrier film 436. In an embodiment, the first barrier film 436 and the second barrier film 438, or one of them, are referred to as a barrier structure. In an embodiment, the barrier structure includes a titanium layer first barrier film 436 and a titanium nitride second barrier film 438. In an embodiment, either of the barrier films 436 or 438 act as an etch stop for various etch processes.

A sacrificial second film (440, not pictured but analogous to the sacrificial second film 140 in FIG. 1A) was disposed above the first dielectric stack 428 and it is etched in a previous first etch process. Consequently, the previous first etch process has rendered the sacrificial second film 440 as a first etch fluid with solution and/or reaction products 441 of the first etch. The solution and/or reaction products 441 of the first etch are depicted as contained 442 proximate 444 the structure 400. In an embodiment, "contained 442 proximate 444 the structure 400" is a state where the first etch has generated a dissolved sacrificial second film and these products are the solution and/or reaction products that are contained 442, including being disposed of, by any conventional method or the like.

Stud capacitors 446 are disposed upon the first cell landing pad 420 and the second cell landing pad 424. The stud capacitors 446 are depicted as being still partially embedded in the dielectric first film 428 during the non-wet etching thereof. In an embodiment, non-wet etching of the dielectric first film 428 is not complete, similar to the depiction in FIG. 4. Consequently, the stud capacitors 446 retain some stability during the first rinse and the ensuing non-wet second etch by virtue of the remnant of the dielectric first film 428. In an embodiment, adhesion between the stud capacitors 446 and the landing pad or the barrier film if present, such as the second barrier film 438, is sufficient to retain the stud capacitors 446 substantially vertical during the non-wet second etch.

The dielectric first film 428 is in the process of being non-wet second etched according to an embodiment. A removed portion 429 of the dielectric first film 438 is depicted as a fluid system including etch vapors and the solution and reaction products of the dielectric first film 438 as it is being etched. In an embodiment similar to the embodiment depicted in FIG. 2, a single dielectric film is wet first etched in a timed etch to expose some of the stud capacitors 446, and the single dielectric film is non-wet second etched as set forth in any of the disclosed embodiments.

A second etch fluid is proximate the structure 400. The second etch fluid is depicted as part of the removed portion 429 of the dielectric first film 428. The second etch fluid includes a non-wet second etch according any of the embodiments set forth in this disclosure.

Formation of the stud 446 is done by opening the via 432 and filling by a conventional method. One method for filling the via 432 with the stud 446 to achieve a given aspect ratio, is set forth in U.S. Pat. No. 6,482,735 to Givens, et al., which is incorporated herein by reference.

Figure 5:
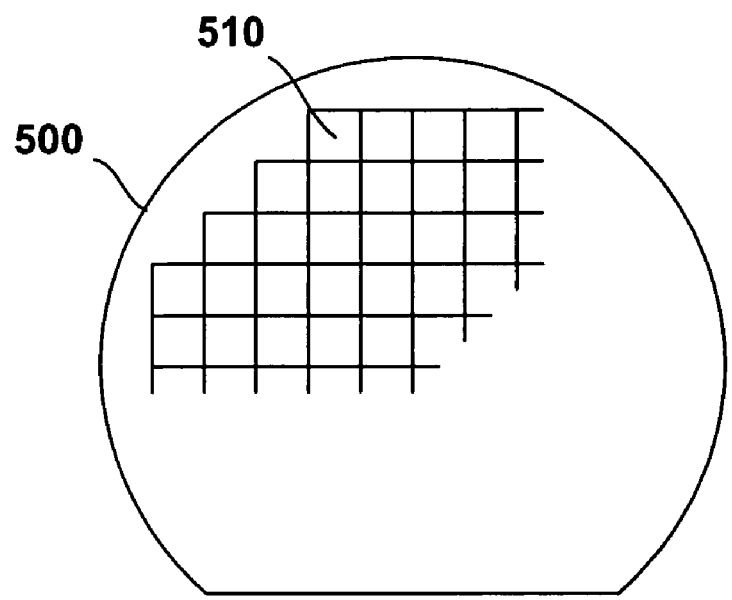
FIG. 5 is a top view of a wafer or substrate containing semiconductor dies in accordance with an embodiment.

FIG. 5 is a top view of a wafer 500 or substrate containing semiconductor dies in accordance with an embodiment. With reference to FIG. 5, a semiconductor die 510 can be produced from the silicon wafer 500 that contains the at least one of the conductive structures such as are depicted in the FIGS. A die 510 is an individual pattern, typically rectangular, on a substrate such as substrate 110 (FIG. 1) or substrate 310 (FIG. 3), substrate 410 (FIG. 4) that contains circuitry to perform a specific function. A semiconductor wafer 500 will typically contain a repeated pattern of such dies 510 containing the same functionality. The die 510 can further contain additional circuitry to extend to such complex devices as a monolithic processor with multiple functionality. The die 510 is typically packaged in a protective casing (not shown) with leads extending therefrom (not shown) providing access to the circuitry of the die 510 for unilateral or bilateral communication and control. In an embodiment, the die 510 is incased in a host such as a chip package (not shown) such as a chip-scale package (CSP).

Figure 6:
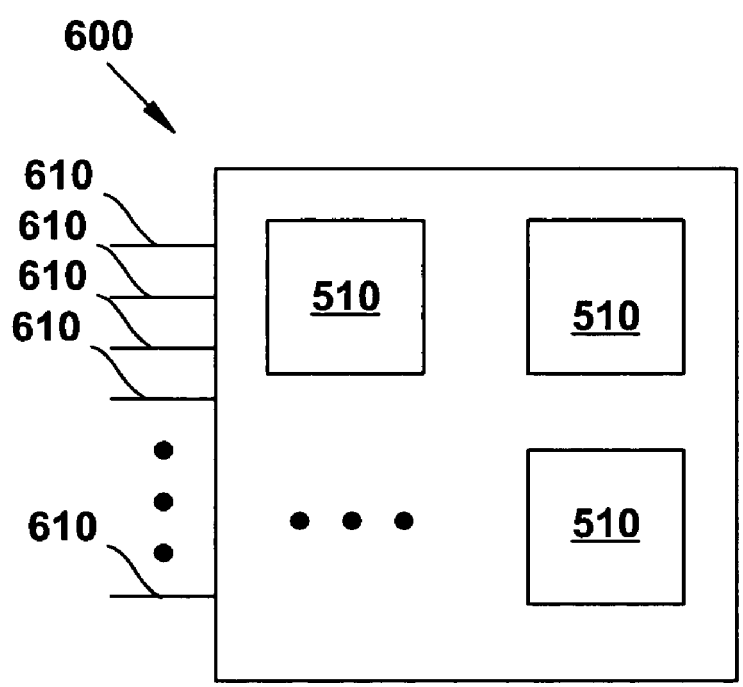
FIG. 6 is a block diagram of a circuit module in accordance with an embodiment.

FIG. 6 is a block diagram of a circuit module 600 in accordance with an embodiment. As shown in FIG. 6, two or more dies 510 at least one of which contains at least one conductive structure such as are depicted in FIGS. 1, 2 and 4 in accordance with various embodiments can be combined, with or without protective casing, into a host such as a circuit module 600 to enhance or extend the functionality of an individual die 510. Circuit module 600 can be a combination of dies 510 representing a variety of functions, or a combination of dies 510 containing the same functionality. Some examples of a circuit module 600 include memory modules, device drivers, power modules, communication modems, processor modules and application-specific modules and can include multi-layer, multi-chip modules. Circuit module 600 can be a sub-component of a variety of electronic systems, such as a clock, a television, a cell phone, a personal computer, an automobile, an industrial control system, an aircraft, a hand-held device, and others. Circuit module 600 will have a variety of leads 610 extending therefrom providing unilateral or bilateral communication and control. In another embodiment, circuit module 600 includes the conductive structure depicted in FIG. 1, FIG. 2, or in FIG. 4 as a two-cell precursor that will be fabricated into a storage device.

Figure 7:
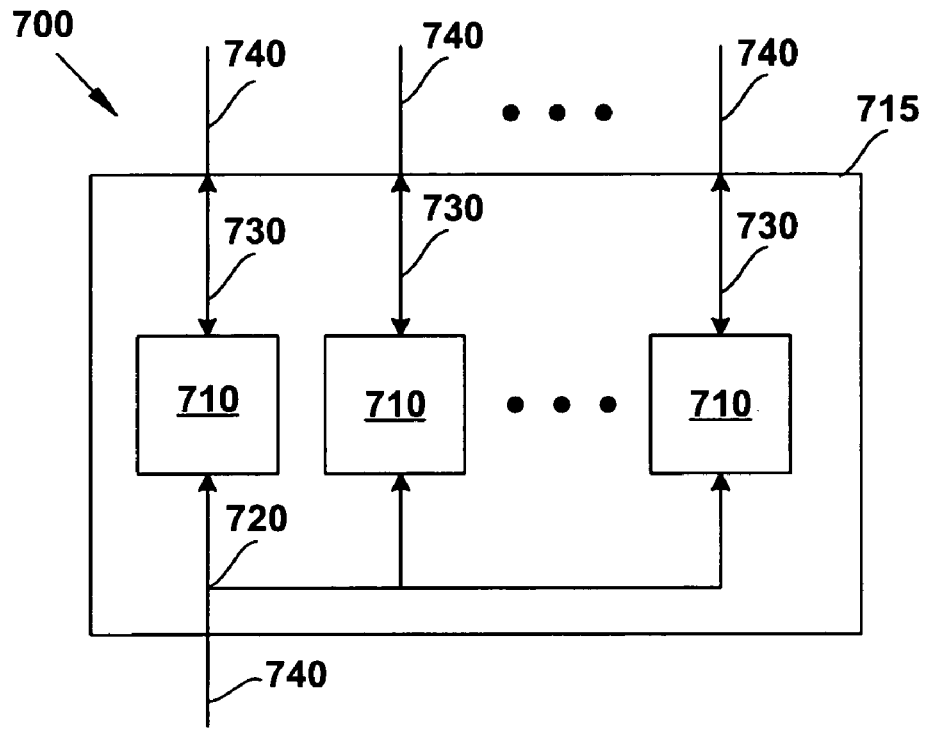
FIG. 7 is a block diagram of a memory module in accordance with an embodiment.

FIG. 7 is a block diagram of a memory module 700 in accordance with an embodiment. FIG. 7 shows one embodiment of a circuit module as a memory module 700 containing a conductive structure embodiment such as are depicted in FIGS. 1, 2, and 4. Memory module 700 is a host that generally depicts a Single In-line Memory Module ("SIMM") or Dual In-line Memory Module ("DIMM"). A SIMM or DIMM can generally be a printed circuit board ("PCB") or other support containing a series of memory devices. While a SIMM will have a single in-line set of contacts or leads, a DIMM will have a set of leads on each side of the support with each set representing separate I/O signals. Memory module 700 contains multiple memory devices 710 contained on a support 715, the number depending upon the desired bus width and the desire for parity. Memory module 700 can contain memory devices 710 on both sides of support 715. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions shown in FIG. 7.

Figure 8:
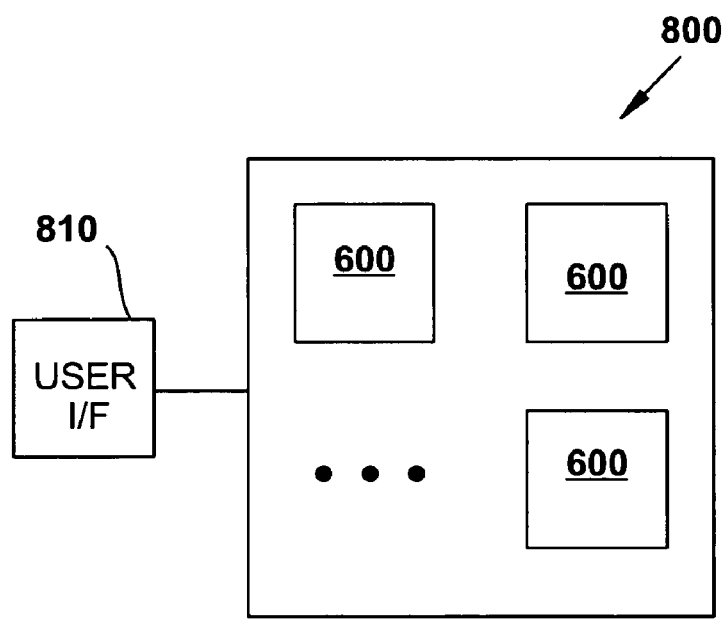
FIG. 8 is a block diagram of an electronic system in accordance with another embodiment.

FIG. 8 is a block diagram of an electronic system 800 in accordance with another embodiment the present invention. FIG. 8 shows another host type such as an electronic system 800 containing one or more circuit modules 600 as described above containing at least one of the conductive structures. Electronic system 800 generally contains a user interface 810. User interface 810 provides a user of the electronic system 800 with some form of control or observation of the results of the electronic system 800. Some examples of user interface 810 include the keyboard, pointing device, monitor and printer of a personal computer; the tuning dial, display and speakers of a radio; the ignition switch or gas pedal of an automobile; and the card reader, keypad, display and currency dispenser of an automated teller machine. User interface 810 can further describe access ports provided to electronic system 800. Access ports are used to connect an electronic system to the more tangible user interface components previously exemplified. One or more of the circuit modules 600 can be a processor providing some form of manipulation, control or direction of inputs from or outputs to user interface 810, or of other information either preprogrammed into, or otherwise provided to, electronic system 800. As will be apparent from the lists of examples previously given, electronic system 800 will often contain certain mechanical components (not shown) in addition to the circuit modules 600 and user interface 810. It will be appreciated that the one or more circuit modules 600 in electronic system 800 can be replaced by a single integrated circuit. Furthermore, electronic system 800 can be a sub-component of a larger electronic system.

Figure 9:
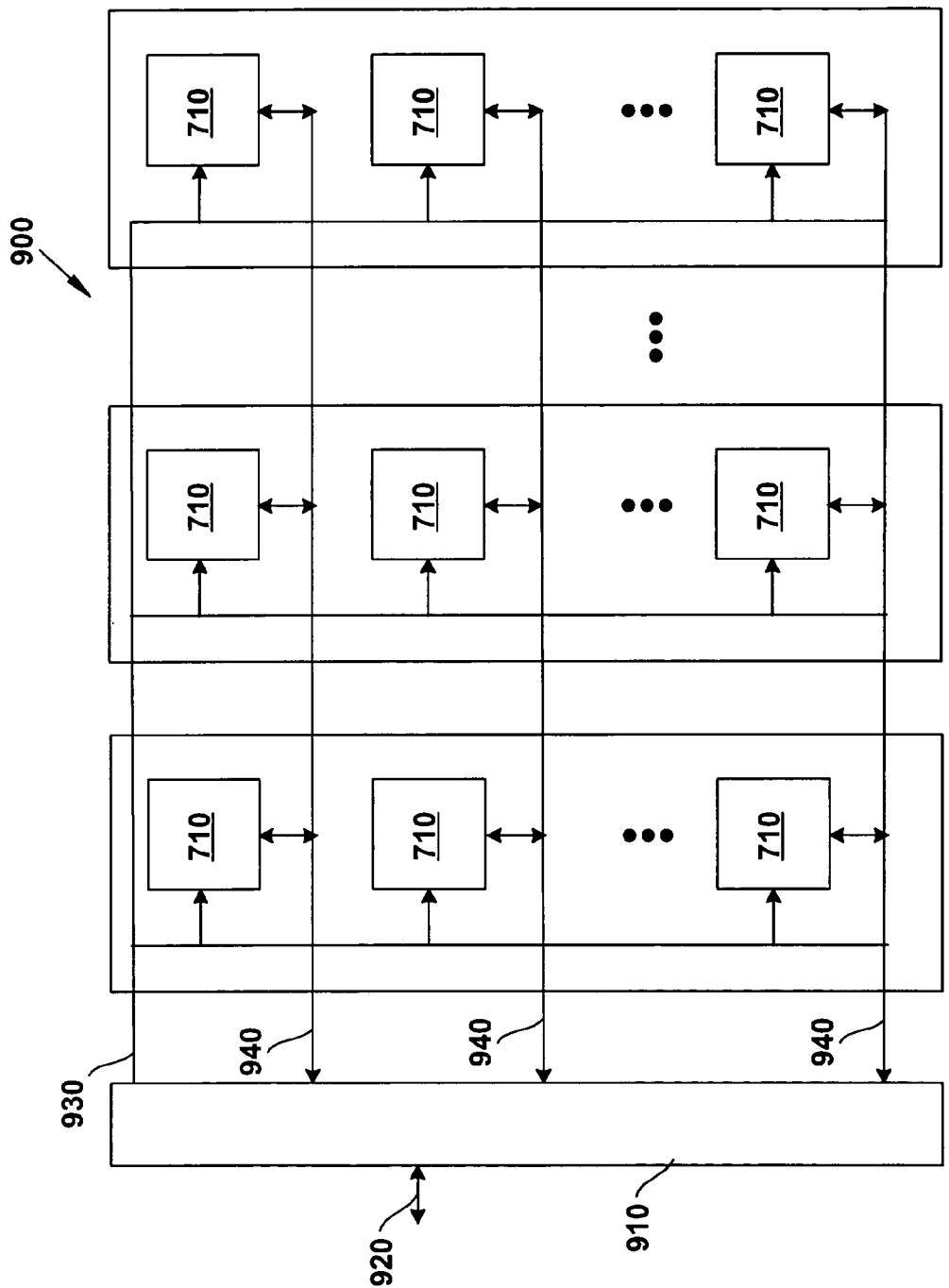
FIG. 9 is a block diagram of a memory system in accordance with an embodiment.

FIG. 9 is a block diagram of a memory system 900 in accordance with an embodiment. FIG. 9 shows one embodiment of an electrical device at a system level. Memory system 900 acts as a higher-level host that contains one or more memory devices 710 as described above including at least one of the conductive structures as set forth herein in accordance with various embodiments, and a memory controller 910 that can also include circuitry that is connected with a conductive structure as set forth herein. Memory controller 910 provides and controls a bi-directional interface between memory system 900 and an external system bus 920. Memory system 900 accepts a command signal from the external system bus 920 and relays it to the one or more memory devices 710 on a command link 930. Memory system 900 provides for data input and data output between the one or more memory devices 710 and external system bus 920 on data links 940.

Figure 10:
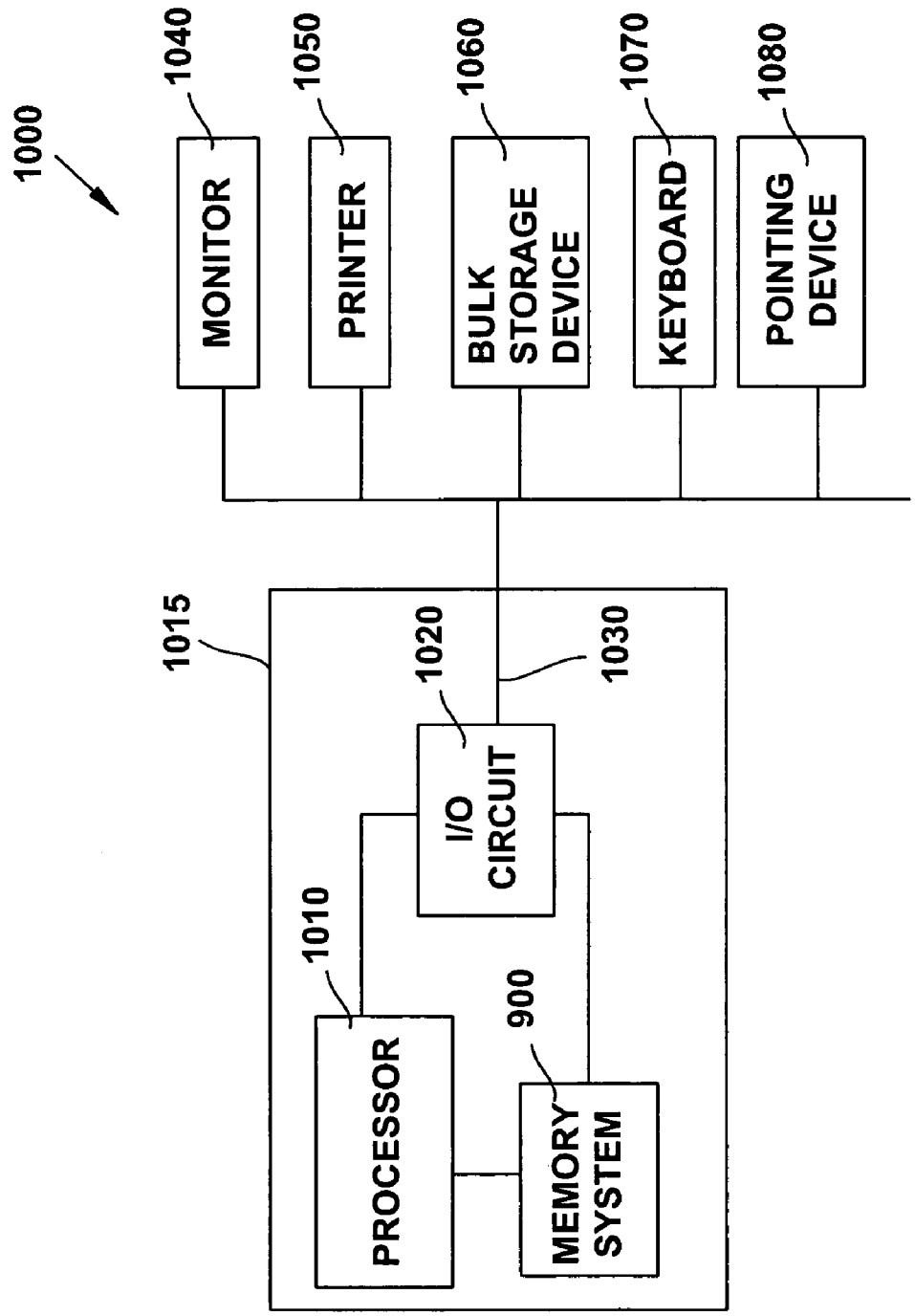
FIG. 10 is a block diagram of a computer system in accordance with an embodiment.

FIG. 10 is a block diagram of a computer system 1000 in accordance with an embodiment. FIG. 10 shows a further embodiment of an electronic system as a computer system 1000. Computer system 1000 contains a processor 1010 and a memory system 900 housed in a computer unit 1015. Computer system 1000 is but one example of an electronic system containing another electronic system, i.e. memory system 900, as a sub-component. The computer system 1000 can contain an input/output (I/O) circuit 1020 that is coupled to the processor 1010 and the memory system 900. Computer system 1000 optionally contains user interface components that are coupled to the I/O circuit 1020. In accordance with the various embodiments, a plurality of stud capacitor structures can be coupled to one of a plurality of I/O pads or pins 1030 of the I/O circuit 1020. The I/O circuit 1020 can then be coupled a monitor 1040, a printer 1050, a bulk storage device 1060, a keyboard 1070 and a pointing device 1080. It will be appreciated that other components are often associated with computer system 1000 such as modems, device driver cards, additional storage devices, etc. It will further be appreciated that the processor 1010, memory system 900, I/O circuit 1020 and partially isolated structures or data storage devices of computer system 1000 can be incorporated on a single integrated circuit, and/or that each of them can include a conductive structure according to an embodiment. Such single package processing units reduce the communication time between the processor 1010 and the memory system 1000.

Conclusion

Thus has been shown processes that result in at least one conductive structure. The conductive structure is exposed by a wet first etch, followed by a non-wet second etch. The conductive structure can be fabricated by various embodiments disclosed.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

While various embodiments have been described and illustrated with respect to forming buried digit line structures, it should be apparent that the same processing techniques can be used to form other structures by the stacked film techniques set forth in this disclosure for other applications. Furthermore, the processes described herein may be used in the development of other three-dimensional semiconductor structures, as well as in the development of other semiconductor structures, such as gates, interconnects, contact pads, and more. Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

The invention claimed is:

1. A process comprising:
    forming a first dielectric layer on a substrate;
    forming a second dielectric layer on the first dielectric layer;
    forming a first recess having a first lateral dimension at a bottom portion of the first dielectric layer in contact with the substrate, and having a second lateral dimension at a top portion of the second dielectric layer;
    forming a conductive structure in the first recess having vertical sidewalls with the first lateral dimension having a value approximately equal to a value of the second lateral dimension;
    first wet etching to expose a first portion of the conductive structure by removing at least a portion of the second dielectric layer;
    first rinsing the conductive structure; and
    second non-wet etching to expose a second portion of the conductive structure by removing at least a remaining portion of the first dielectric layer and exposing at least a portion of the substrate.

2. The process of claim 1, wherein the second dielectric film includes a polysilicon film.

3. The process of claim 1, wherein first wet etching has a rate that is faster than second non-wet etching.

4. The process of claim 1, wherein the first wet etching is selected from the group consisting of a wet process and a vapor process, and wherein the second non-wet etching is selected from the group consisting of a vapor process and a dry process.

5. The process of claim 1, wherein the substrate includes a single dielectric stack, wherein first wet etching is selected from the group consisting of a wet process and a vapor process, wherein second non-wet etching is selected from the group consisting of a vapor process and a dry process, and wherein the single dielectric stack is selected from the group consisting of undoped spin-on dielectric, undoped vapor-deposited dielectric, doped spin-on dielectric, and doped vapor-deposited dielectric.

6. The process of claim 1, wherein the substrate includes a single dielectric stack, wherein first wet etching is selected from the group consisting of a wet process and a vapor process, wherein second non-wet etching is selected from the group consisting of a vapor process and a dry process, and wherein the single dielectric stack is selected from the group consisting of spin-on undoped silica, spin-on doped silica, borophospho silicate glass, borosilicate glass, phospho silicate glass, doped oxide from the decomposition of tetraethyl ortho silicate, and undoped oxide from the decomposition of tetraethyl ortho silicate.

7. The process of claim 2, wherein forming a first recess includes forming the recess in a dielectric first film that is disposed above the substrate, and in a second film that is disposed above and on the dielectric first film.

8. The process of claim 1, wherein first wet etching includes a first etch chemistry, wherein second non-wet etching includes a second etch chemistry different from the first etch chemistry.

9. The process of claim 1, wherein the first wet etching exposes a first portion of the conductive structure by removing all of the second dielectric layer.

10. The process of claim 1, wherein the first wet etching exposes a first portion of the conductive structure by removing all of the second dielectric layer and exposing at least a portion of the substrate.

11. The process of claim 1, wherein the second dielectric layer further includes a polysilicon layer selected from the group consisting of undoped polysilicon, and heavily doped polysilicon.

12. The process of claim 1, wherein the conductive structure is coupled to a substrate active area.

13. The process of claim 1, wherein the conductive structure includes a container capacitor.

14. The process of claim 1, further including forming a storage cell plate over the conductive structure.

15. The process of claim 1, wherein the conductive structure is formed to extend above a remaining portion of the first dielectric stack to form an exposed vertical portion not in contact with dielectric.

* * * * *